United States Patent
Moriya et al.

(10) Patent No.: US 8,354,730 B2
(45) Date of Patent: Jan. 15, 2013

(54) MANUFACTURING METHOD OF SEMICONDUCTOR DEVICE AND SEMICONDUCTOR DEVICE

(75) Inventors: Satoshi Moriya, Akishima (JP); Toshio Saito, Akiruno (JP); Goichi Yokoyama, Iruma (JP); Tsuyoshi Fujiwara, Hamura (JP); Hidenori Sato, Ome (JP); Nobuaki Miyakawa, Wako (JP)

(73) Assignees: Hitachi, Ltd., Tokyo (JP); Honda Motor Co., Ltd., Tokyo (JP)

( * ) Notice: Subject to any disclaimer, the term of this patent is extended or adjusted under 35 U.S.C. 154(b) by 858 days.

(21) Appl. No.: 11/997,436

(22) PCT Filed: Aug. 25, 2006

(86) PCT No.: PCT/JP2006/316734
§ 371 (c)(1),
(2), (4) Date: Jan. 31, 2008

(87) PCT Pub. No.: WO2007/023947
PCT Pub. Date: Mar. 1, 2007

(65) Prior Publication Data
US 2010/0090307 A1     Apr. 15, 2010

(30) Foreign Application Priority Data
Aug. 26, 2005   (JP) ................................. 2005-245552

(51) Int. Cl.
*H01L 21/70* (2006.01)
(52) U.S. Cl. ................ 257/520; 257/E29.064
(58) Field of Classification Search ............... 257/202, 257/203, 211, 508, 520, 523, 621, E29.018, 257/E29.064
See application file for complete search history.

(56) References Cited

U.S. PATENT DOCUMENTS

| | | | | |
|---|---|---|---|---|
| 6,809,421 B1* | 10/2004 | Hayasaka et al. | ............. | 257/777 |
| 7,279,376 B2* | 10/2007 | Otsuki | .......................... | 438/221 |
| 7,291,911 B2 | 11/2007 | Usami | | |
| 2002/0070418 A1* | 6/2002 | Kinzer et al. | ................. | 257/496 |
| 2003/0077877 A1 | 4/2003 | Hartwell | | |
| 2004/0262767 A1* | 12/2004 | Matsuo | ......................... | 257/758 |
| 2005/0101054 A1 | 5/2005 | Mastromatteo et al. | | |
| 2005/0221601 A1* | 10/2005 | Kawano | ......................... | 438/622 |
| 2006/0278988 A1 | 12/2006 | Trezza et al. | | |

FOREIGN PATENT DOCUMENTS

| | | |
|---|---|---|
| JP | 61-067932 | 4/1986 |
| JP | 03-218049 | 9/1991 |
| JP | 03-234041 | 10/1991 |
| JP | 05-021592 | 1/1993 |
| JP | 11-261000 | 9/1999 |
| JP | 2002289623 A | 10/2002 |

(Continued)

*Primary Examiner* — Ha Tran T Nguyen
*Assistant Examiner* — Vongsavanh Sengdara
(74) *Attorney, Agent, or Firm* — Antonelli, Terry, Stout & Kraus, LLP.

(57) ABSTRACT

A structure obtaining a desired integrated circuit by sticking together a plurality of semiconductor substrates and electrically connecting integrated circuits formed on semiconductor chips of the respective semiconductor substrates is provided, and a penetrating electrode penetrating between a main surface and a rear surface of each of the semiconductor substrates and a penetrating separation portion separating the penetrating electrode are separately arranged. Thereby, after forming an insulation trench portion for formation of the penetrating separation portion on the semiconductor substrate, a MIS•FET is formed, and then, a conductive trench portion for formation of the penetrating electrode can be formed. Therefore, element characteristics of a semiconductor device having a three-dimensional structure can be improved.

7 Claims, 20 Drawing Sheets

FOREIGN PATENT DOCUMENTS

| JP | 2002-334967 | 11/2002 |
| JP | 2003151978 A | 5/2003 |
| JP | 2004-335836 | 11/2004 |
| JP | 2005-026582 | 1/2005 |
| JP | 2005-222994 | 8/2005 |
| JP | 2008-547206 A | 12/2008 |

* cited by examiner

MANUFACTURING METHOD OF SEMICONDUCTOR DEVICE AND SEMICONDUCTOR DEVICE

TECHNICAL FIELD

The present invention relates to a manufacturing method of a semiconductor device and semiconductor device technology, in particular, to technology applied effectively to a manufacturing method of a semiconductor device having a three-dimensional structure and semiconductor device technology.

BACKGROUND ART

The semiconductor device having a three-dimensional structure gains much attention as an important structure avoiding various barriers that a semiconductor device having a two-dimensional structure faces, such as limitation of lithography technology, saturation tendency of operation speed caused by increase of wiring resistance and parasitic effect, high electric field effect caused by miniaturization of element dimensions and the like and maintaining improvement of integration degree by integrating semiconductor elements in a three-dimensional manner in a structure composed of semiconductor active layers laminated in multi-layers.

As for the semiconductor device having a three-dimensional structure, there are descriptions, for example, in Japanese Patent Application Laid-Open Publication No. 11-261000 (Patent Document 1) or Japanese Patent Application Laid-Open Publication No. 2002-334967 (Patent Document 2), and a manufacturing method of the semiconductor device having a three-dimensional structure by sticking together semiconductor substrates having semiconductor elements formed is disclosed. Further, in these documents, a structure in which a penetrating electrode called a vertical mutual connection body or an embedded connection electrode is formed in a groove penetrating main and rear surfaces of a desired semiconductor substrate so that the main and rear surfaces of the semiconductor substrate are conductive is disclosed.

Patent Document 1: Japanese Patent Application Laid-Open Publication No. 11-261000
Patent Document 2: Japanese Patent Application Laid-Open Publication No. 2002-334967

DISCLOSURE OF THE INVENTION

In general, in a manufacturing process of a semiconductor device, as a method to reduce electric resistance of a connection hole electrically connecting wire of a lower layer and wire of an upper layer (or wire and a semiconductor substrate), a method closely-arranging many square connection holes having a small diameter is employed.

However, in the manufacturing process of the semiconductor device having a three-dimensional structure in which a plurality of chips or wafers are laminated and stuck together, it is necessary to form a deep conductive groove having an aspect ratio of about 20 to 30 in a wafer and embed a conductive film connecting upper and lower chips inside thereof.

With regard to such a deep conductive groove formation process, in a case where it is combined with an existing LSI process, it is necessary to suppress influence thereof. The influence is influence to an LSI fabrication process (flatness, connection hole (Via) processability and the like) and a device (a heat load, stress and the like). Therefore, an examination of a plane surface pattern and a cross sectional structure of the deep conductive groove is the most important issue.

Accordingly, an object of the present invention is to provide technology improving element characteristics of the semiconductor device having a three-dimensional structure.

The above and other objects and novel characteristics of the present invention will be apparent from the description of this specification and the accompanying drawings.

The typical ones of the inventions disclosed in this application will be briefly described as follows.

The present invention is a manufacturing method of a semiconductor device having a structure comprising a first separation portion extending in a thickness direction of a semiconductor wafer on a first surface of the semiconductor wafer and a second separation portion extending in the thickness direction of the semiconductor wafer from the first surface to a position deeper than the first separation portion; comprising a process forming a first groove extending in the thickness direction of the semiconductor wafer from an upper surface of the first separation portion comprises: a process forming a first insulation film over an inside surface of the first groove by a thermal oxidization method; a process filling inside of the first groove with an embedded film via the first insulation film; a process removing an upper portion of the embedded film so that an upper surface of the embedded film in the first groove is concaved lower with respect to the upper surface of the first separation portion; and a process embedding a second insulation film into a concave formed by removing the upper portion of the embedded film.

And, the present invention is a semiconductor device having a pattern comprising: an element formed over a first surface of a desired semiconductor substrate and structuring an integrated circuit; a penetrating electrode provided to penetrate from the first surface to a second surface of the desired semiconductor substrate and electrically connecting integrated circuits of a plurality of semiconductor substrates; and a penetrating separation portion provided so as to surround the penetrating electrode at a position away from the penetrating electrode in a surface of the first surface of the desired semiconductor substrate and provided to penetrate from the first surface to the second surface of the desired semiconductor substrate, wherein a region having the penetrating electrode arranged is an active region in the pattern.

The effects obtained by typical aspects of the present invention will be briefly described below.

That is, element characteristics of the semiconductor device having a three-dimensional structure can be improved.

BEST MODE FOR CARRYING OUT THE INVENTION

In the following embodiments, a description will be given by dividing into a plurality of sections or embodiments as occasion demands as a matter of convenience, however, the elements are not nothing to each other except a particularly clear description, but one is a modified example, details, a supplementary explanation or the like of a part or a whole of the other. And, in the following embodiments, in the case of referring to a number of elements (including a number, a numerical value, an amount, a range and the like), the present invention is not limited to the defined number except the case of the particular definition and the case of apparently limited to the specific number in principle, but may be equal to or more than the defined number or equal to or less than the defined number. Furthermore, in the following embodiments, it is needless to say that a constituent element (including a elemental step and the like) thereof is not necessarily essential except the case of the particular definition and the case of apparently essential in principle. In the same manner, in the following embodiments, in the case of referring to shape and positional relation of constituent element and the like, one similar or conformable substantially to the shape and the like is included. This is much the same for abovementioned number and range. And, components having the same function are denoted by the same reference symbols throughout the drawings for describing the embodiment, and the repetitive description thereof will be omitted as much as possible. Hereinafter, embodiments of the present invention will be described in detail with reference to the accompanying drawings.

Figure 1:
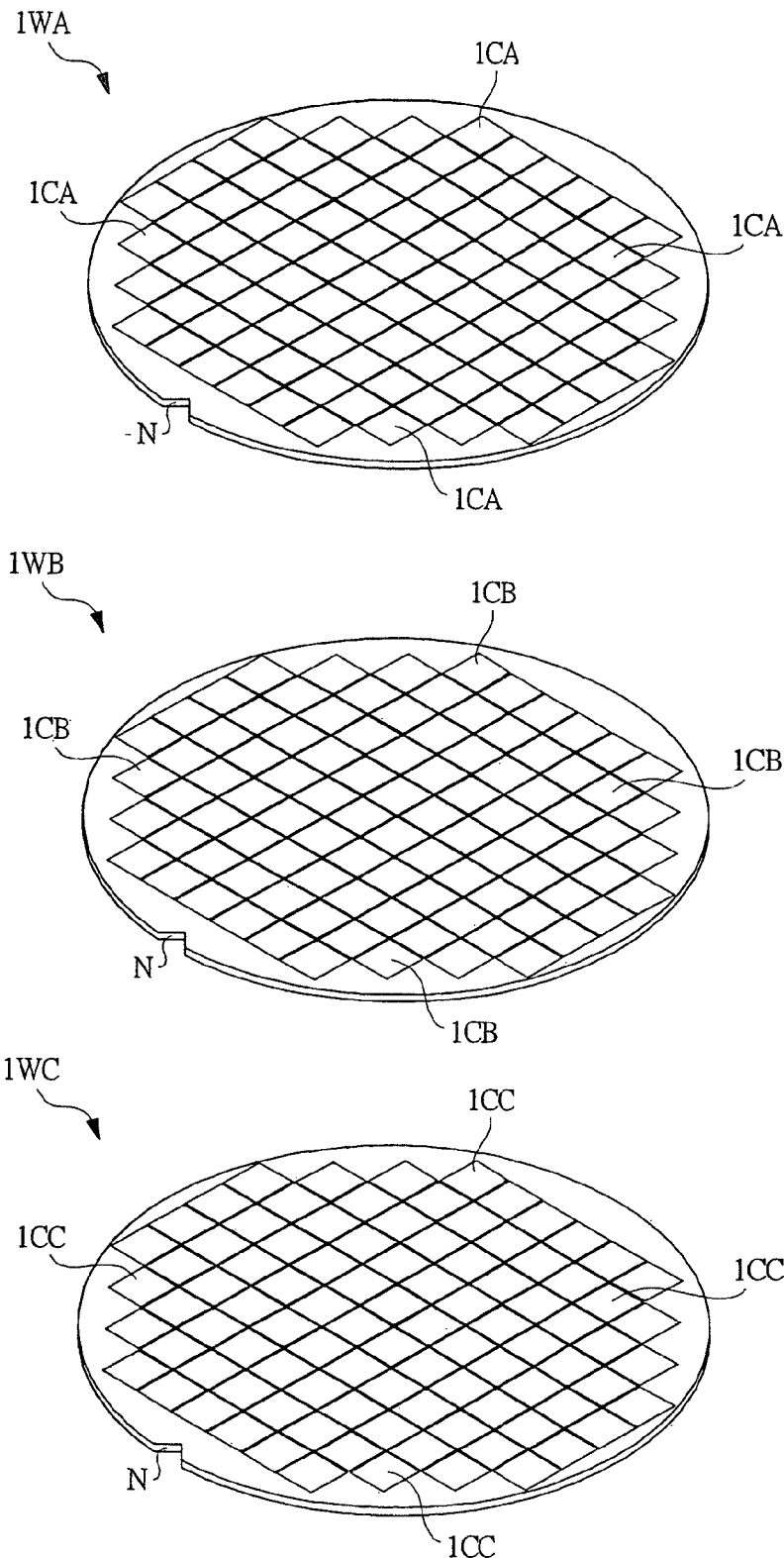
FIG. 1 is an overall perspective view showing each of a plurality of semiconductor wafers in a manufacturing process of a semiconductor device according to an embodiment of the present invention.

A manufacturing method of a semiconductor device according to the present embodiment is explained with reference to FIG. 1 and FIG. 2. FIG. 1 is an overall perspective view showing each of a plurality of semiconductor wafers in a manufacturing process of a semiconductor device according to the present embodiment, and FIG. 2 is a cross sectional view showing a main portion of each semiconductor chip of a desired semiconductor wafer among the plurality of semiconductor wafers in FIG. 1.

First, as shown in FIG. 1, a plurality of semiconductor wafers (hereinafter, referred to simply as wafers) 1WA, 1WB and 1WC each having a main surface (first surface) and a rear surface (second surface) positioned at mutually opposite sides along a thickness direction are prepared. Subsequently, on the main surfaces of the respective wafers 1WA, 1WB and 1WC, a plurality of semiconductor chips (hereinafter, referred to simply as chips) 1CA, 1CB and 1CC are formed. The respective wafers 1WA, 1WB and 1WC are structured of a semiconductor thin plate of a plane roughly circular made mainly of, for example, silicon (Si) single crystal. In the present embodiment, these plural wafers 1WA, 1WB and 1WC are stuck together as described later and thereby a semiconductor device having a three-dimensional structure is realized. The wafer 1WA shows a wafer at a highest stage, the wafer 1WB shows a wafer at a middle stage and the wafer 1WC shows a wafer at a lowest stage.

The plural chips 1CA, 1CB and 1CC are arranged regularly in a matrix along left, right, up and down directions on the main surfaces of the wafers 1WA, 1WB and 1WC. On the respective chips 1CA, 1CB and 1CC of the respective wafers 1WA, 1WB and 1WC, through wafer process, integrated circuits such as logic circuits, memory circuits and the like are formed. The wafer process is called also as a front-end and includes a film formation process, a lithography process, an etching process, an impurity addition process and the like. The chips 1CA, 1CB and 1CC of the respective wafers 1WA, 1WB and 1WC are formed so that dimensions, shapes and arrangement coordinates of their planes are mutually identical.

Figure 2:
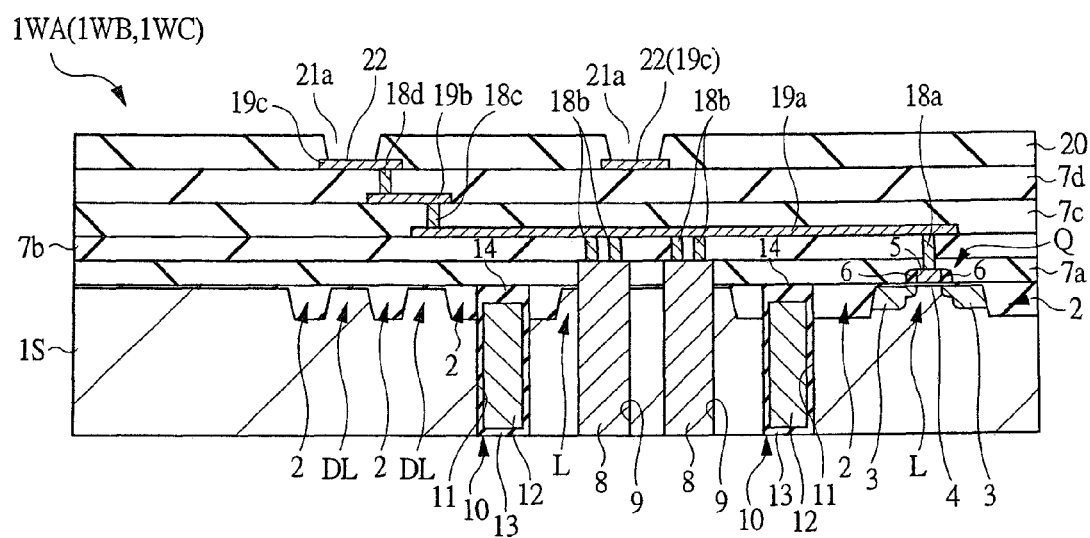
FIG. 2 is a cross sectional view showing a main portion of each semiconductor chip of the plurality of semiconductor wafers in FIG. 1.

Each of the wafers 1WA, 1WB and 1WC has a semiconductor substrate (hereinafter, referred to simply as substrate) 1S, as shown in FIG. 2. This substrate 1S is structured of, for example, p-type silicon single crystal and has a main surface (that is, main surfaces and first surfaces of the wafers 1WA, 1WB, 1WC) and a rear surface (that is, rear surfaces and second surfaces of the wafers 1WA, 1WB, 1WC) positioned at mutually opposite sides along the thickness direction thereof.

On the main surface of each substrate 1S of the respective wafers 1WA, 1WB and 1WC, a groove-shaped separation portion (trench separation portion) 2 called for example STI (Shallow Trench Isolation) or SGI (Shallow Groove Isolation) is formed. This groove-shaped separation portion 2 is formed by embedding an insulation film such as silicon oxide and the like into a groove formed in the main surface of each substrate 1S, and by this separation portion 2, an active region L and a dummy active region DL are defined on the main surface of each substrate 1S.

In the active region L surrounded by the separation portion 2 in the main surface of each substrate 1S of the wafers 1WA, 1WB and 1WC, an integrated circuit element (hereinafter, referred to simply as element) structuring the integrated circuit is formed. Here, as the element, a MIS•FET (Metal Insulator Semiconductor Field Effect Transistor) Q is illustrated for example. As examples of this element, besides the MIS•FET, there are an active element such as a bipolar transistor, a diode and the like. Further, as other examples of the element, there is a passive element such as a resistor (a diffusion resistor formed by adding impurities to the substrate 1S and a resistor structured by a pattern of polycrystal silicon formed over the substrate 1S), a capacitor, an inductor and the like.

The MIS•FET Q has a semiconductor region 3 for source and drain, a gate insulation film 4 and a gate electrode 5. The semiconductor region 3 for source and drain is formed by adding desired impurities (for example phosphorous (P) or arsenic (As) in a case of an n-channel type MIS•FET Q, boron (B) in a case of a p-channel type MIS•FET Q) to the substrate 1S. The gate insulation film 4 is made of, for example, silicon oxide and formed over the main surface of each substrate 1S. The gate electrode 5 is made of, for example, polycrystal silicon with low resistance and formed over the gate insulation film 4. On a side surface of the gate electrode 5, a side wall 6 made of, for example, silicon oxide is formed. This MIS•FET Q is covered with an interlayer insulation film 7a deposited over the main surface of each substrate 1S. Note that, by forming an n-channel type MIS•FET and a p-channel type MIS•FET, a CMIS (Complementary MIS) circuit may be formed.

And, in other active region L having no element formed, a penetrating electrode 8 is arranged. The reason of not arranging the separation portion 2 in the arrangement region of the penetrating electrode 8 is, if the separation portion 2 is arranged in the arrangement region of the penetrating electrode 8, the separation portion 2 having large area is formed in the region, and consequently, when forming the separation portion 2 by Chemical Mechanical Polishing (hereinafter, referred to simply as CMP), an approximately center portion of a plane surface of the separation portion 2 having large area is concaved with respect to the periphery because of so-called erosion and flatness of the main surface of the substrate 1S is destroyed. And, if the separation portion 2 exists in a formation region of the penetrating electrode 8, also a part of the separation portion 2 must be etched and removed upon formation of a penetrating hole 9, and consequently, a hole making process becomes difficult.

Such a penetrating electrode 8 has, for example, a main conductive film (conductive portion) and a barrier conductive film (conductive portion) formed so as to cover a side surface and a bottom surface thereof. The main conductive film is made of a high melting point metal film such as tungsten (W) and the like, and the barrier conductive film is made of a high melting point metal nitride film such as titanium nitride (TiN) and the like. The barrier conductive film directly contacts substrates 1SA and 1SB via an inside wall surface of the penetrating hole 9. The barrier conductive film has a function to suppress reaction of material of the main conductive film and Si of the substrate 1S at a contact portion of the penetrating electrode and the substrate 1S and diffusion of silicon of the substrate 1S toward a main conductive film side.

The reason of not arranging the penetrating separation portion 10 in the active region L is, if the penetrating separation portion 10 is formed in the active region L, because of difference of material of the penetrating separation portion 10 and the substrate 1S, an upper portion of the penetrating separation portion 10 protrudes from or is concaved in the main surface of the substrate 1S by a cleaning processing or an etching processing in the manufacturing process of the semiconductor device, and consequently, the flatness of the main surface of the substrate 1S is destroyed.

Such a penetrating separation portion 10 has an embedded film 12, an insulation film 13 formed so as to cover a side surface and a bottom surface thereof and a cap insulation film 14 formed so as to cover an upper surface of the embedded film 12.

The embedded film 12 is made of, for example, a true semiconductor film such as polycrystal silicon to which impurities are not added intentionally and the like. Thickness (volume) of the embedded film 12 is made thicker (larger) than that of the insulation film 13. If inside of the penetrating hole 11 is filled up with only the thermal oxide film, a "pore" is formed at center of the penetrating separation portion 10 (seam of the thermal oxide film growing from inner circumference of the penetrating hole 11 toward center), and consequently, the flatness of the main surface of the substrate 1S may be destroyed. Further, even if the penetrating hole 11 is filled up with a CVD oxide film after the thermal oxide film is formed, stress caused by difference of thermal expansion coefficients of an insulation film embedded in the penetrating hole 11 and the substrate 15 is applied to the penetrating separation portion 10, a fine crystal defect and the like occur in the substrate 15, and consequently, electric characteristics of an element formed on the substrate 15 may be deteriorated. Therefore, in the present embodiment, a polycrystal silicon film with excellent bump covering property is embedded into the penetrating hole 11 after formation of the thermal oxide film by the CVD method and the like. Thereby, formation of the "pore" at center of the penetrating separation portion 10 can be restrained or prevented, and as a result, the flatness of the main surface of the substrate 15 can be secured. Furthermore, by forming the embedded film 12 by the same silicon as the substrate 15, the thermal expansion coefficients of the embedded film 12 and the substrate 15 can be equal or nearly equal, as a result, thermal stress generated in the penetrating separation portion 10 can be reduced. Thereby, generation of a crystal defect and the like at a portion of the penetrating separation portion 10 in the substrate 15 can be restrained or prevented, and consequently, deterioration of the electric characteristics of the element formed on the substrate 1S can be restrained or prevented.

The insulation film 13 is made of, for example, silicon oxide ($SiO_2$) and the like and formed by a thermal oxidization method and the like. That is, by forming the insulation film 13 by a thermal oxide film having fewer defects and higher insulation property than a CVD oxide film, separation performance of the penetrating separation portion 10 can be improved. That is, performance to separate the penetrating electrode 8 from peripheral portion of the substrate 1S can be improved. Note that, the insulation film 13 may be formed of a laminated film of a thermal oxide film and a CVD oxide film. Thereby, covering property of the insulation film 13 in the penetrating hole 11 can be improved.

The cap insulation film 14 is a component covering an upper surface of the embedded film 12. An upper surface of the cap insulation film 14 forms an upper surface of the penetrating separation portion 10 and conforms or nearly conforms to an upper surface of the groove-shaped separation portion 2. The cap insulation film 14 is made of, for example, silicon oxide and in particularly, formed of insulation material having the same or almost the same range of an etching rate as that of the insulation film structuring the separation portion 2. Thereby, the flatness of the main surface of the substrate 1S can be secured. That is, if difference in etching rates of the separation portion 2 and the cap insulation film 14 is large, difference of etching amounts of the separation portion 2 and the cap insulation film 14 occurs in a cleaning processing and an etching processing in the manufacturing process of the semiconductor device, and consequently, upper surface height of the cap insulation film 14 may become higher or lower than upper surface height of the separation portion 2, and concave and convex may be formed in the main surface of the substrate 1S. If there are concave and convex in the main surface of the substrate 1S, various defects may occur, for example, wires formed on an upper layer thereof may be disconnected, incomplete exposure may occur at transfer of a desired pattern, electric characteristics of wires may be changed and the like. On the other hand, as in the present embodiment, by making etching rates of the insulation film structuring the separation portion 2 and the cap insulation film 14 the same or nearly the same range, etching amounts of the separation portion 2 and the cap insulation film 14 in the cleaning processing and the etching processing in the manufacture process of the semiconductor device can be equal or nearly equal, and consequently, the flatness of the upper surface of the separation portion 2 can be secured. That is, since the flatness of the main surface of the substrate 1S can be secured, it is possible to restrain or prevent various defects such as wire disconnection failure, incomplete exposure, fluctuation of electric characteristics of the wiring layer and the like.

As explained above, in the present embodiment, by separating the penetrating electrode 8 and the penetrating separation portion 10, the penetrating electrode 8 and the penetrating separation portion 10 can be formed separately as described later. Thereby, each of the penetrating electrode 8 and the penetrating separation portion 10 can be formed in a suitable process as described later. Further, since the penetrating electrode 8 and the penetrating separation portion 10 are separated, each of the penetrating electrode 8 and the penetrating separation portion 10 can be formed so that functions required respectively are achieved.

Over the main surface of each substrate 1S of the respective wafers 1WA, 1WB and 1WC, a wiring layer is formed. Here, although a case in which a three-layers wiring structure is formed on respective wafers 1WA, 1WB and 1WC is illustrated, the present invention is not limited thereto, but a one-layer wiring structure, a two-layers wiring structure, a four-layers wiring structure or a wiring structure having four or more layers may be formed. Further, the number of wiring layers may be different in respective wafers 1WA, 1WB and 1WC.

The wiring layers of the respective wafers 1WA, 1WB and 1WC have interlayer insulation films 7a to 7d, plugs 18a to 18d, wires 19a to 19c, and a protection film 20. The interlayer insulation films 7a to 7d are made of, for example, silicon oxide, and the plugs 18a to 18d and the wires 19a to 19c are made of a metal film such as tungsten, aluminum (Al), copper (Cu) or the like, for example.

In the respective wafers 1WA, 1WB and 1WC, over the interlayer insulation film 7b, a first layer wire 19a is formed. In the respective wafers 1WA, 1WB and 1WC, the first layer wire 19a is electrically connected to the MIS•FET Q via the plug 18a (herein, a case in which the wire 19a is electrically connected to a gate electrode 5 of the MIS•FET Q is illustrated). And, in the wafers 1WA and 1WB at the highest stage and the middle stage, the first layer wire 19a is electrically connected to the penetrating electrode 8 via the plug 18b. This plug 18b is arranged so as to avoid center of the upper surface of the penetrating electrode 8 (seam portion, seam of conductive film for plug formation). This is for improving connection property of the penetrating electrode 8 and the plug 18b. This is described later.

In such a stacking process of the wafers 1WA, 1WB and 1WC, the following is carried out, for example. First, on an end portion of the penetrating electrode 8 on a rear surface of the wafer 1WA, a bump electrode is formed. Then, positions of the wafer 1WA and the wafer 1WB to be stuck to the lower layer thereof are set, and the wafer 1WA and the wafer 1WB are stuck together by connecting the wafer 1WA and the wafer 1WB via the bump electrode on the rear surface of the wafer 1WA. By repeating such procedures, the plurality of wafers 1WA, 1WB and 1WC are laminated.

Next, a formation method of the chips 1CA, 1CB and 1CC of the respective wafers 1WA, 1WB and 1WC is explained with reference to a process flow in FIG. 3. Note that, a formation method of the chip 1CB of the wafer 1WB at the middle stage is illustrated here.

Figure 3:
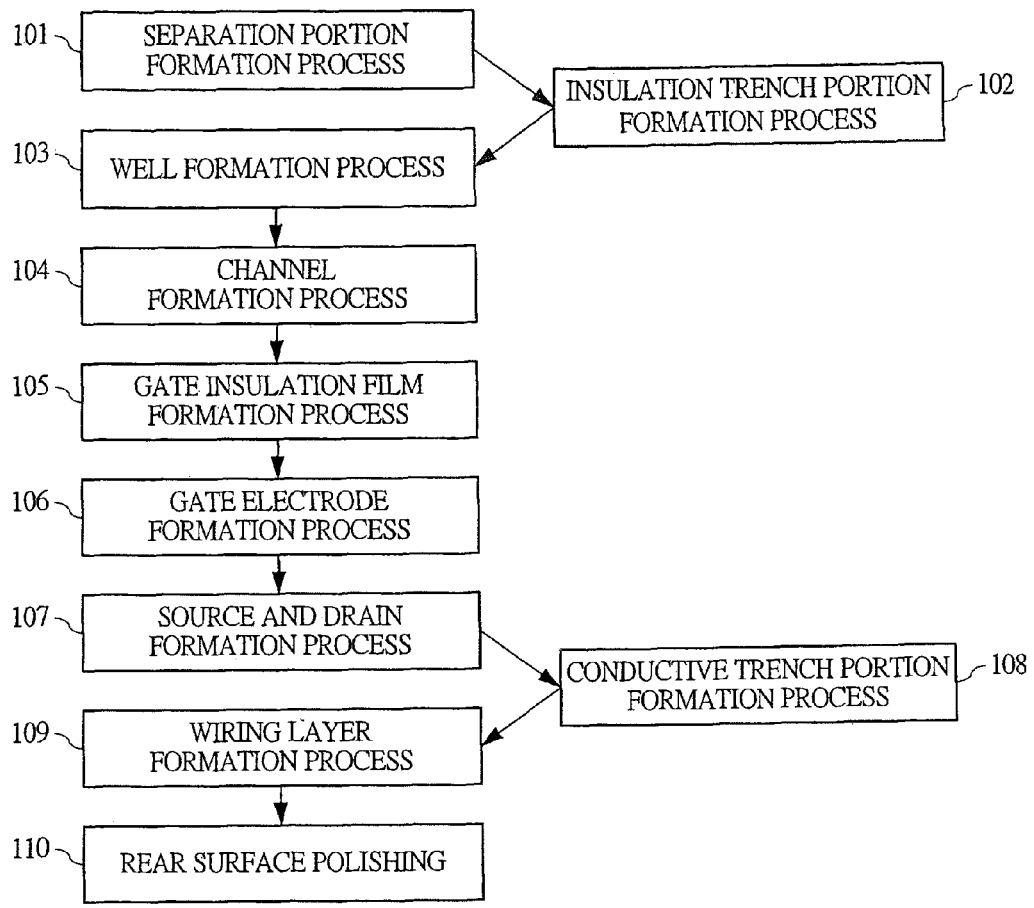
FIG. 3 is a flow chart of a formation process of a semiconductor chip of the semiconductor wafer in FIG. 1.
Figure 4:
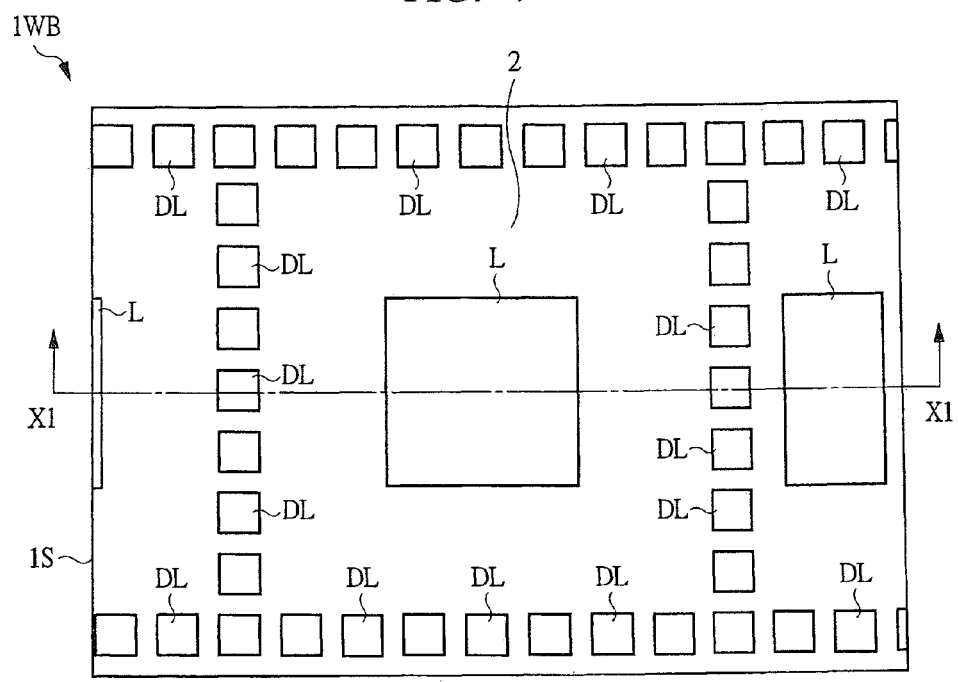
FIG. 4 is a plan diagram showing a main portion of a main surface of a semiconductor wafer after a separation portion formation process.
Figure 5:
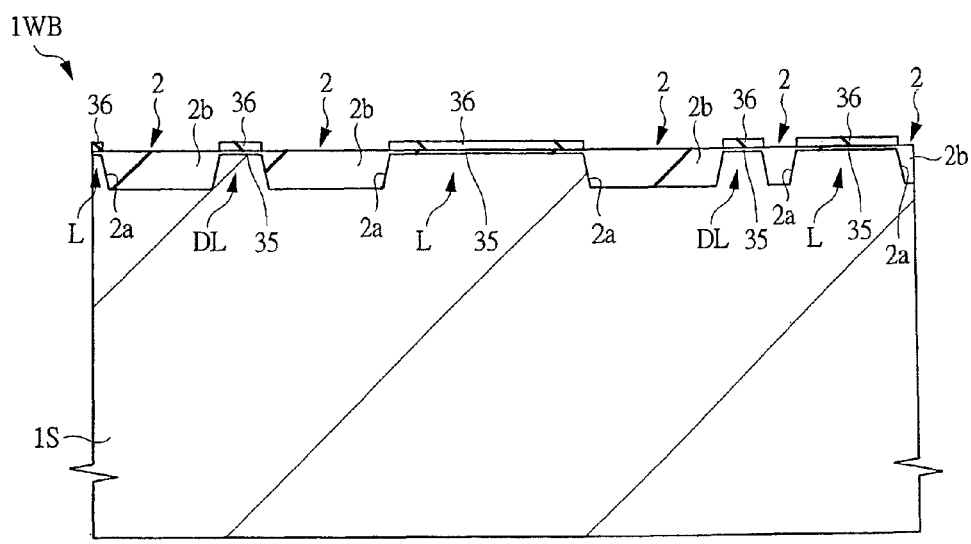
FIG. 5 is a cross sectional view along X1-X1 line in FIG. 4.

First, on the main surface of the wafer 1WB, the groove-shaped separation portion (first separation portion) 2 is formed (process 101 in FIG. 3). FIG. 4 is a plan diagram showing a main portion of the main surface of the wafer 1WB after the formation process of the groove-shaped separation portion 2 and FIG. 5 is a cross sectional view along X1-X1 line in FIG. 4.

Here, first, on the main surface of the wafer 1WB having the substrate 1S made of, for example, p-type silicon (Si) single crystal, a pad insulation film 35 made of, for example, silicon oxide is formed by a thermal oxidization method and the like. Next, over the insulation film 35, an insulation film made of, for example, silicon nitride ($Si_3N_4$ or the like) is deposited by the CVD method or the like, then, a series of processings such as application of a photo resist film, exposure, development and the like (hereinafter, referred to as photolithography) are carried out thereon to form a photo resist pattern (hereinafter, referred to simply as resist pattern), and further, using the resist pattern as an etching mask, a portion of the insulation film exposed therefrom is removed, and thereby a pattern of the insulation film 36 made of silicon nitride or the like is formed. The pattern of the insulation film 36 is formed so that a formation region of the separation portion 2 is exposed and formation regions of the active region L and the dummy active region DL are covered.

Next, using the insulation film 36 as an etching mask, the substrate 1S exposed therefrom is etched, and thereby a separation groove 2a is formed in the main surface of the substrate 1S. The separation groove 2a is formed so as to extend to a first position in a midstream of a thickness direction of the substrate 1S (a direction perpendicular to the main surface of the substrate 1S) from the main surface of the substrate 1S. Then, on the main surface of the wafer 1WB, by the CVD method using mixed gas of ozone ($O_3$) and TEOS (Tetra Ethyl Ortho Silicate) gas for example, an insulation film made of, for example, silicon oxide is deposited, and then, the insulation film is polished by the CMP method and the like so as to embed the separation groove 2a. In this polishing processing, a superfluous insulation film outside of the separation groove 2a is removed and the insulation film 2b is embedded into only inside of the separation groove 2a. Thereby, with formation of the grove-shaped separation portion 2, the active region L and the dummy active region DL defined by this separation portion 2 are formed. Thereafter, the insulation film 36 is etched and removed.

The active region L is a region in which the element and the penetrating electrode 8 are arranged. The dummy active region DL is not provided for arranging the element and the penetrating electrode 8, but for reducing a plane area of the separation portion 2. That is, upon the CMP processing for formation of the separation portion 2, if the separation portion 2 having wide plane area exists, center of the upper surface of the separation portion 2 (insulation film 2b) is concaved because of so-called erosion, and therefore, the dummy active region DL is provided to restrain or prevent it. Accordingly, the dummy active region DL is provided at a portion in which the plane area of the separation portion 2 is wide. Thereby, the flatness of the main surface of the substrate 1S can be secured at this stage. In particular, in the present embodiment, although the penetrating separation portion 10 is arranged around the penetrating electrode 8 as mentioned above, the plane area of the separation portion 2 around the penetrating electrode 8 becomes wide in consideration of arrangement of the penetrating separation portion 10 and the concave tends to occur. Therefore, in the present embodiment, a plurality of dummy active regions DL are arranged around the penetrating electrode 8 (or between adjacent active regions L in which different penetrating electrodes 8 are arranged) and between an active region L in which the penetrating electrode 8 is arranged and an active region L in which the element is arranged. Thereby, it is possible to restrain or prevent a concave from occurring in the upper surface of the separation portion 2 around the penetrating electrode 8. Note that, a plane pattern of each dummy active region DL is a plane rectangular pattern smaller than the active region L.

Figure 6:
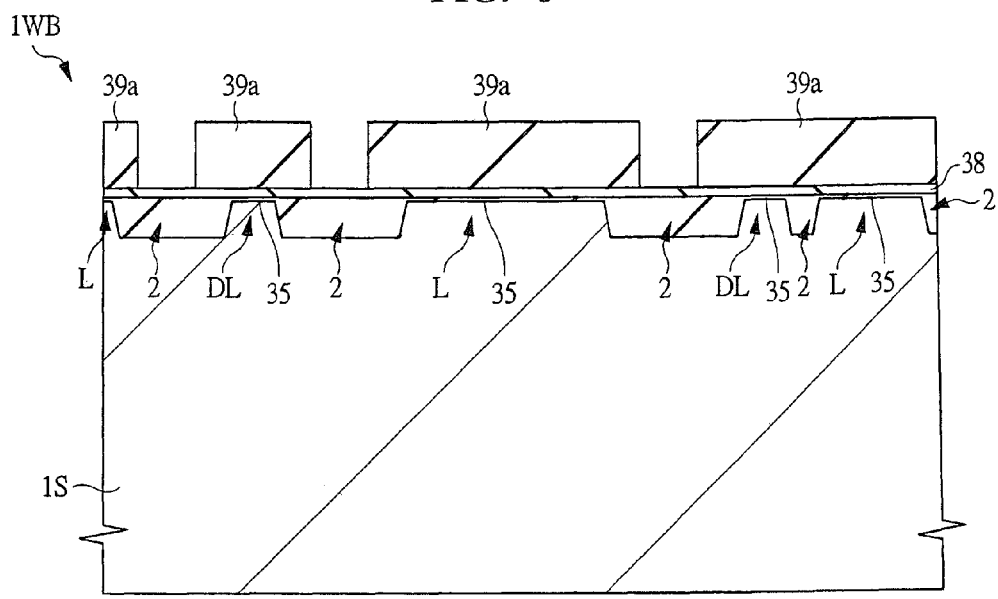
FIG. 6 is a cross sectional view showing a portion corresponding to the X1-X1 line in FIG. 4 of a semiconductor wafer in a manufacturing process subsequent to FIG. 5.

Next, the procedure shifts to a formation process of an insulation trench portion (process 102 in FIG. 3). Hereinafter, a formation method of this insulation trench portion is explained with reference to FIG. 6 to FIG. 16. FIG. 6 is a cross sectional view showing a portion corresponding to the X1-X1 line in FIG. 4 of the wafer 1WB in a manufacturing process subsequent to FIG. 5, FIG. 7 is a plan diagram showing a main portion of the main surface of the wafer 1WB after a separation groove formation process subsequent to FIG. 6 and FIG. 8 is a cross sectional view at an X1-X1 line in FIG. 7.

First, as shown in FIG. 6, on the main surface of the wafer 1WB, an insulation film 38 made of, for example, silicon nitride is deposited by the CVD method or the like, and then, on the insulation film 38, a resist pattern 39a is formed by photolithography technology. The resist pattern 39a is formed so that a formation region of the insulation trench portion (penetrating separation portion 10) is exposed and the other regions are covered.

Figure 7:
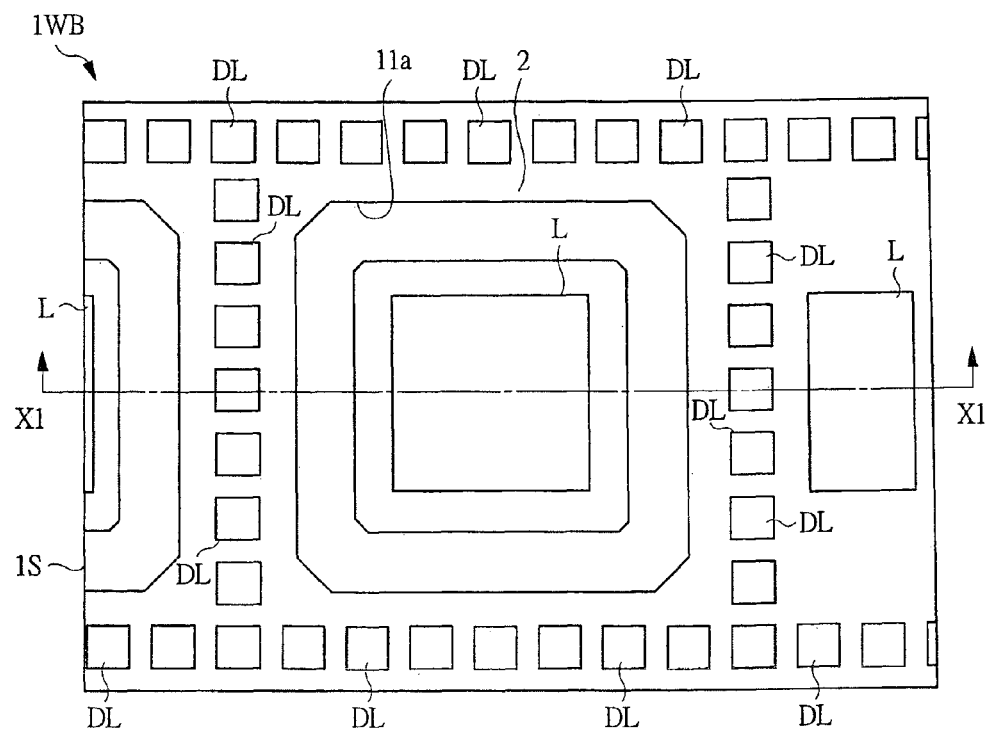
FIG. 7 is a plan diagram showing a main portion of a main surface of a semiconductor wafer after a separation groove formation process subsequent to FIG. 6.
Figure 8:
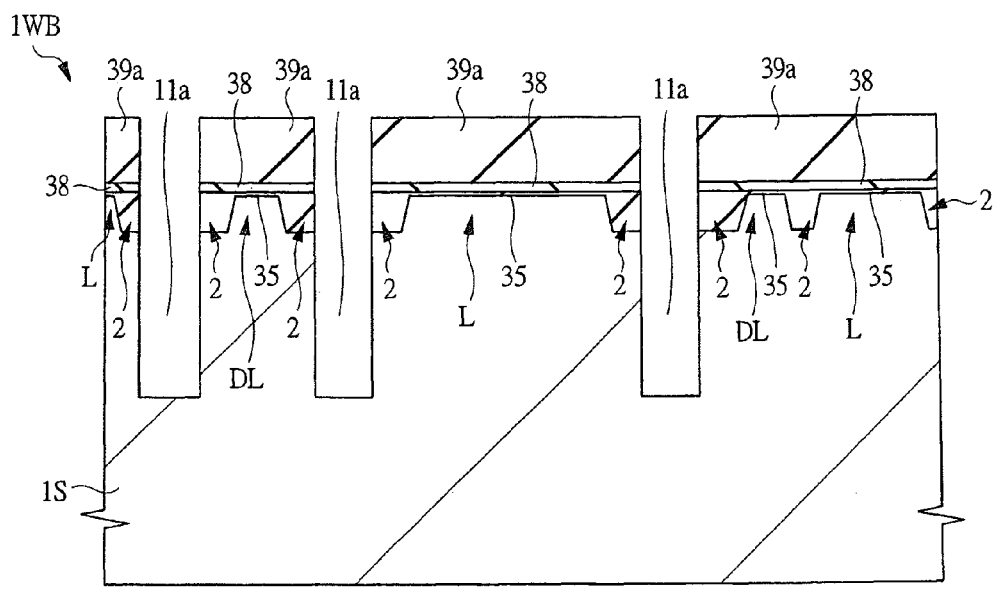
FIG. 8 is a cross sectional view along X1-X1 line in FIG. 7.

Then, as shown in FIG. 7 and FIG. 8, using the resist pattern 39a as an etching mask, the insulation film 38, the insulation film 2b of the separation portion 2 and the substrate 1S exposed therefrom are etched and removed in order, and thereby a separation groove (first groove) 11a is formed on the main surface of the substrate 1S. This separation groove 11a is a groove to form the penetrating hole 11, and formed so as to extend to a second position which is in a midstream of a thickness direction of the substrate 1S from the main surface of the substrate 1S and is deeper than the first position (depth of the separation groove 2a).

Note that, after the insulation film 38 is etched and removed by the resist pattern 39a, the separation groove 11a may be formed by removing the resist pattern 39a and using the left insulation film 38 as an etching mask.

Figure 9:
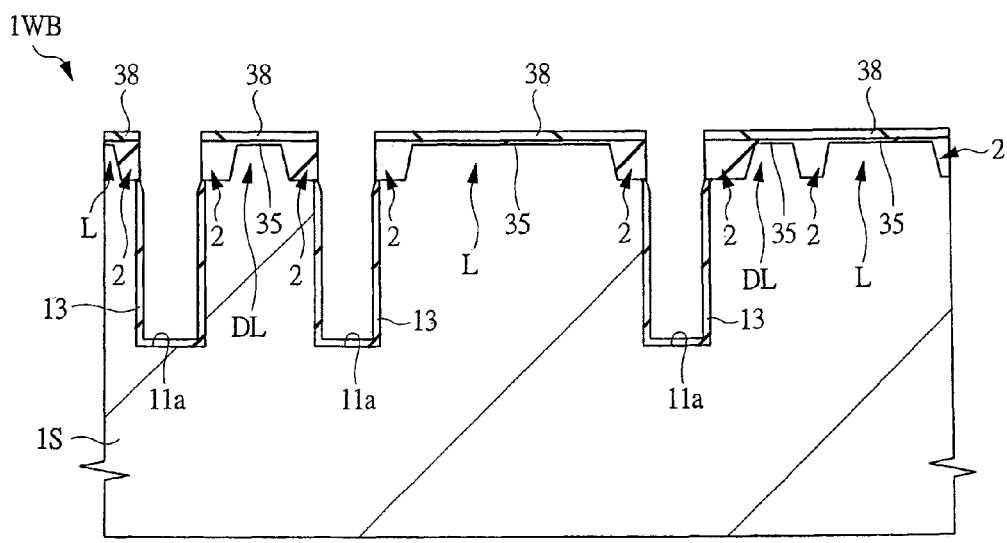
FIG. 9 is a cross sectional view showing a portion corresponding to the X1-X1 line in FIG. 7 of a semiconductor wafer after a thermal oxide film formation process subsequent to FIG. 8.
Figure 10:
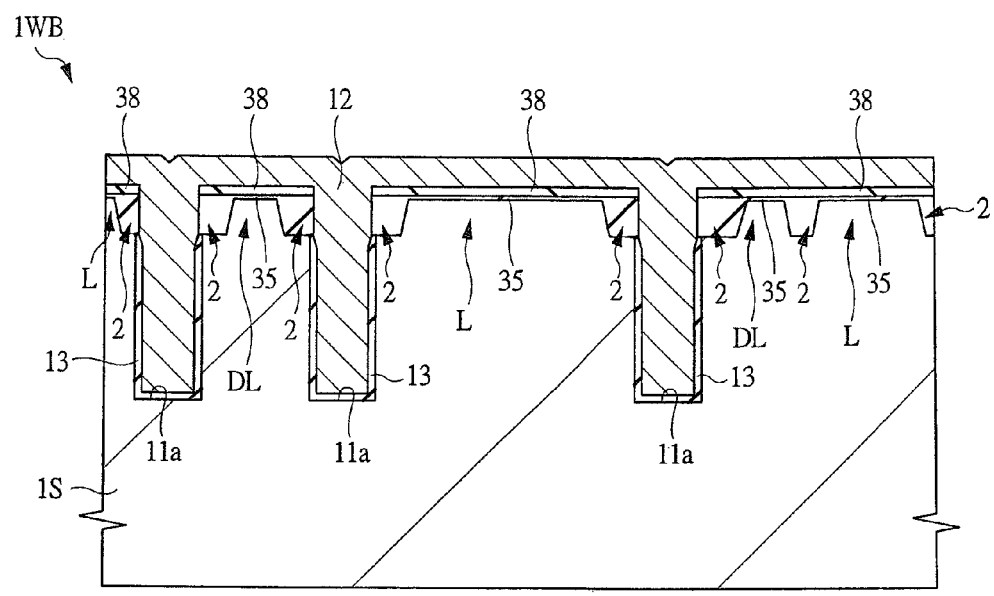
FIG. 10 is a cross sectional view showing a portion corresponding to the X1-X1 line in FIG. 7 of a semiconductor wafer after an embedded film deposition process subsequent to FIG. 9.
Figure 11:
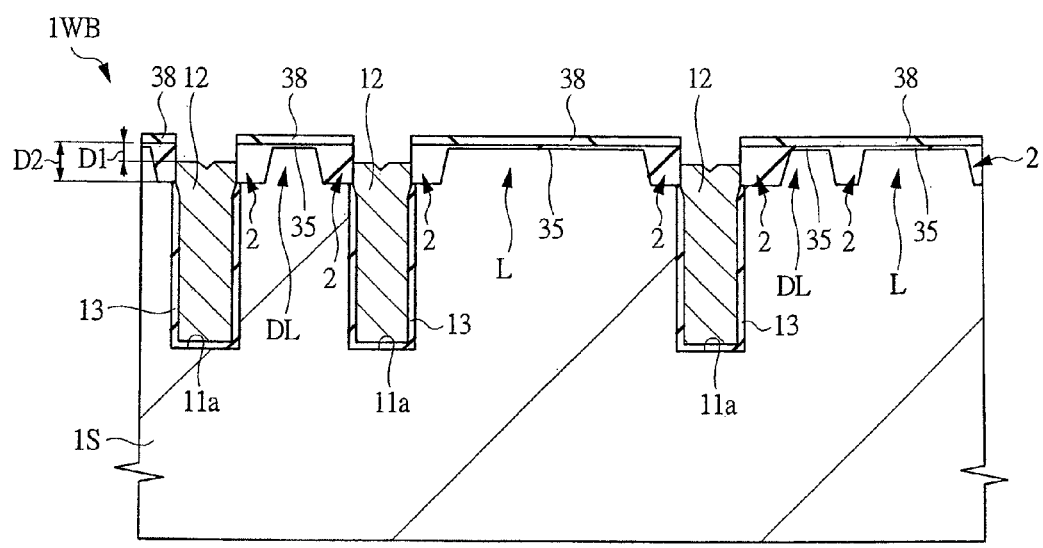
FIG. 11 is a cross sectional view showing a portion corresponding to the X1-X1 line in FIG. 7 of a semiconductor wafer after an embedded film etch back process subsequent to FIG. 10.

Next, FIG. 9 is a cross sectional view showing a portion corresponding to the X1-X1 line in FIG. 7 of the wafer 1WB after a thermal oxide film formation process subsequent to FIG. 8, FIG. 10 is a cross sectional view showing a portion corresponding to the X1-X1 line in FIG. 7 of the wafer 1WB after an embedded film deposition process subsequent to FIG. 9 and FIG. 11 is a cross sectional view showing a portion corresponding to the X1-X1 line in FIG. 7 of the wafer 1WB after an embedded film etch back process subsequent to FIG. 10.

Here, first, after removing the resist pattern 39a shown in FIG. 8, by performing a thermal oxidization process to the substrate 1S of the wafer 1WB, on an exposed surface of the substrate 1S of an inside surface (side surface and bottom surface) of the separation groove 11a, an insulation film (first insulation film) 13 made of, for example, silicon oxide ($SiO_2$ or the like) is formed by a thermal oxidization method, as shown in FIG. 9. Thus, by forming the insulation film 13 by a thermal oxide film having fewer defects and higher insulation property than a CVD oxide film, insulation separation performance of the penetrating separation portion 10 can be improved. Further, since the element is not formed on the main surface of the wafer 1WB at this stage, there is no defect such as diffusion of impurities in a semiconductor region structuring the element caused by a thermal process at the formation of the insulation film 13, and therefore, there is no defect such as fluctuations of electric characteristics (threshold value voltage and the like) of the element. Accordingly, the electric characteristics of the element can be improved.

Next, as shown in FIG. 10, on the main surface of the substrate 1SB of the wafer 1WB, the embedded film 12 is deposited by the CVD method and the like so that the separation groove 11a is filled up. This embedded film 12 is made of, for example, a true semiconductor film such as polycrystal silicon and the like to which impurities are not added intentionally, and a thickness thereof is made thicker than that of the insulation film 13. By filling up the separation groove 11a with the embedded film 12, formation of the "pore" at center of the separation groove 11a can be restrained or prevented and formation of concave and convex in an upper surface side of the separation groove 11a caused by the "pore" can be restrained or prevented, and accordingly, the flatness of the main surface of the substrate 1S can be secured. Further, by forming the embedded film 12 by the same silicon as the substrate 1S, the thermal expansion coefficients of the embedded film 12 and the substrate 1S can be equal or nearly equal, as a result, thermal stress generated in the separation groove 11a can be reduced. Thereby, it is possible to restrain or prevent generation of crystal defects and the like in the substrate 1S at a portion of the separation groove 11a, and consequently, deterioration of electric characteristics of the element formed on the substrate 1S can be restrained or prevented.

Thereafter, by etching-back the embedded film 12 by an anisotropic dry etching method, as shown in FIG. 11, a superfluous embedded film 12 outside of the separation groove 11a is removed and the embedded film 12 is left only inside of the separation groove 11a. At this time, an over etching processing is carried out so that depth D1 from the upper surface of the separation portion 2 to the upper surface of the embedded film 12 is roughly half of thickness D2 of the separation portion 2. Thereby, the upper surface of the embedded film 12 is concaved by the depth D1 from the upper surface of the separation portion 2. Note that, the main surface of the substrate 1S is protected by the insulation film 38 and is not damaged.

Figure 12:
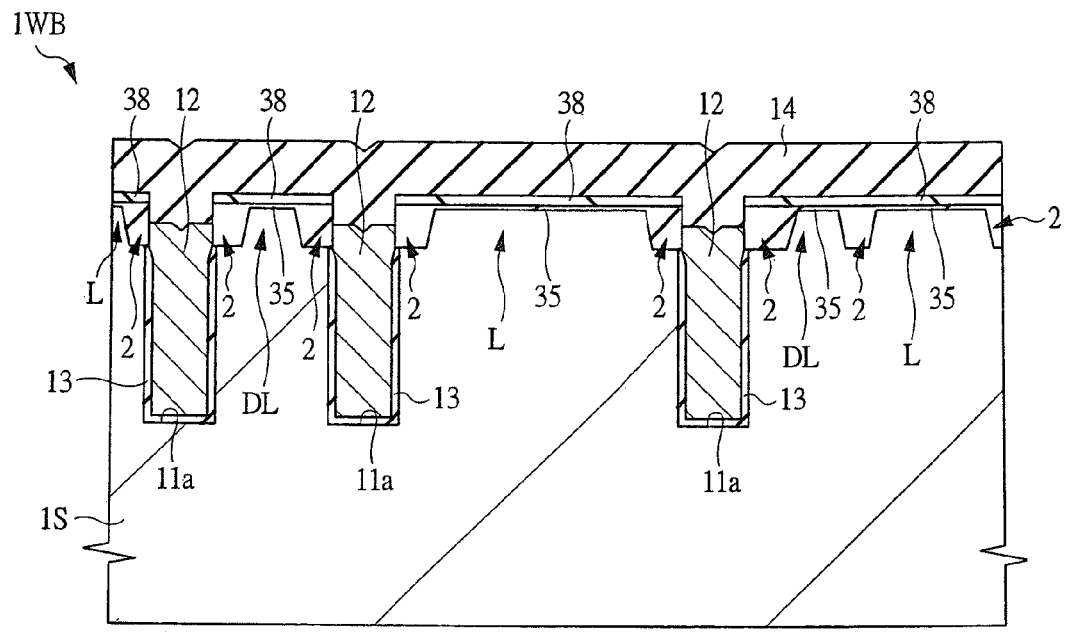
FIG. 12 is a cross sectional view showing a portion corresponding to the X1-X1 line in FIG. 7 of a semiconductor wafer after a cap insulation film deposition process subsequent to FIG. 11.
Figure 13:
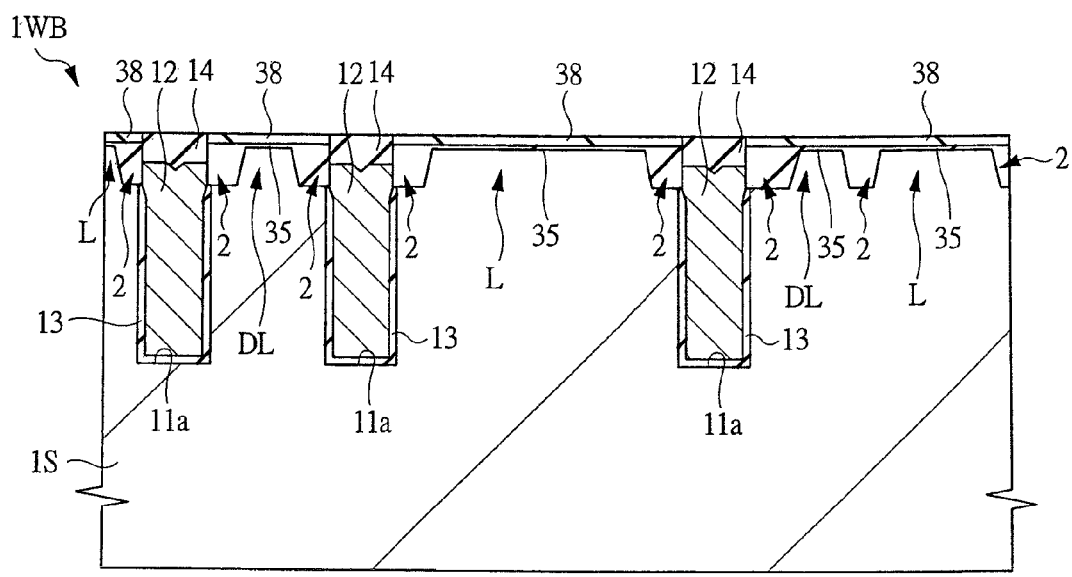
FIG. 13 is a cross sectional view showing a portion corresponding to the X1-X1 line in FIG. 7 of a semiconductor wafer after a cap insulation film formation process subsequent to FIG. 12.
Figure 14:
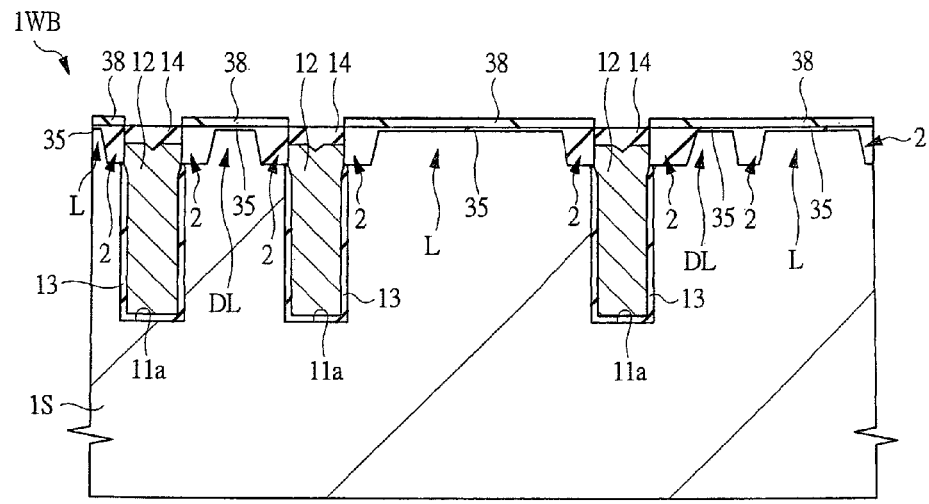
FIG. 14 is a cross sectional view showing a portion corresponding to the X1-X1 line in FIG. 7 of a semiconductor wafer after the cap insulation film formation process subsequent to FIG. 13.
Figure 15:
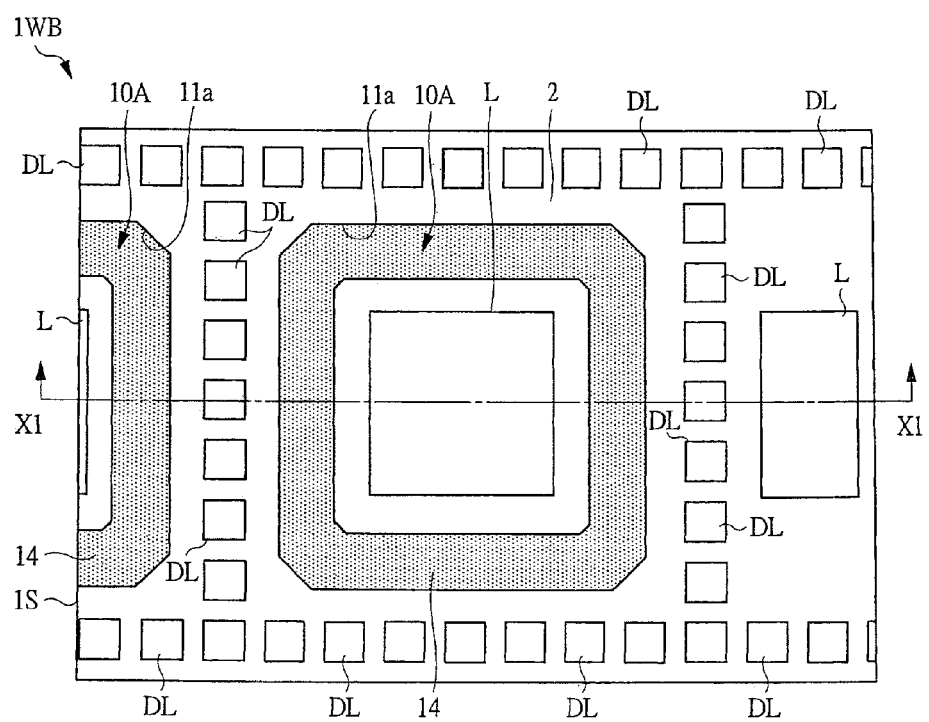
FIG. 15 is a plan diagram showing a main portion of a semiconductor wafer after an insulation trench portion formation process subsequent to FIG. 14.
Figure 16:
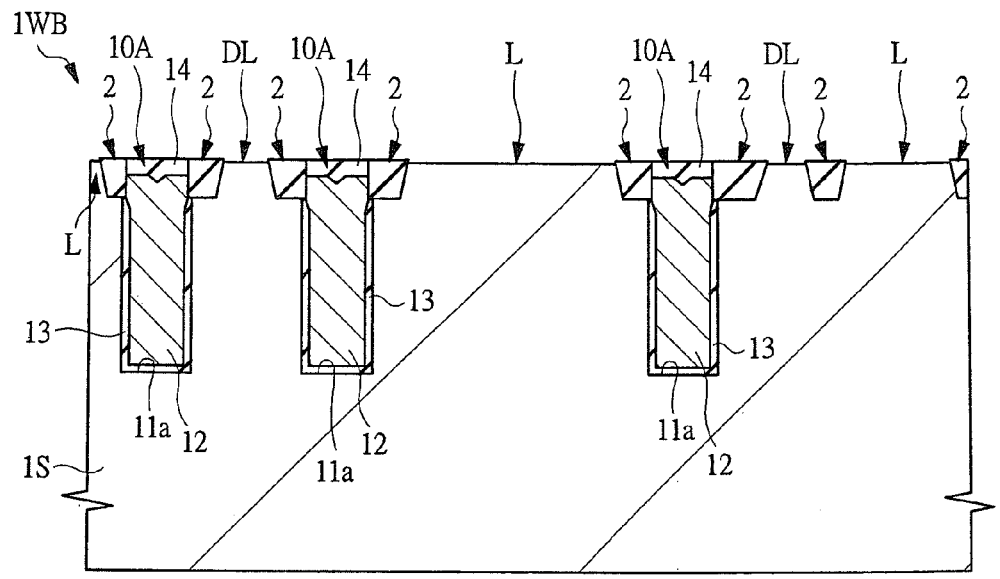
FIG. 16 is a cross sectional view along X1-X1 line in FIG. 15.

Next, FIG. 12 is a cross sectional view showing a portion corresponding to the X1-X1 line in FIG. 7 of the wafer 1WB after a cap insulation film deposition process subsequent to FIG. 11, FIG. 13 is a cross sectional view showing a portion corresponding to the X1-X1 line in FIG. 7 of the wafer 1WB after the cap insulation film formation process subsequent to FIG. 12, FIG. 14 is a cross sectional view showing a portion corresponding to the X1-X1 line in FIG. 7 of the wafer 1WB after a cap insulation film formation process subsequent to FIG. 13, FIG. 15 is a plan diagram showing a main portion of the wafer 1WB after an insulation trench portion formation process subsequent to FIG. 14, and FIG. 16 is a cross sectional view along an X1-X1 line in FIG. 15.

First, as shown in FIG. 12, on the main surface of the wafer 1WB, a cap insulation film (second insulation film) 14 made of, for example, silicon oxide is deposited by the CVD method and the like so that the concave in upper portion of the embedded film 12 is embedded, and then by polishing the cap insulation film 14 by the CMP method and the like, as shown in FIG. 13, a superfluous cap insulation film 14 outside of the concave in an upper portion of the embedded film 12 is removed, and the cap insulation film 14 is left only inside of the concave in the upper portion of the embedded film 12. Thus, the upper surface of the embedded film 12 is covered with the cap insulation film 14. The upper surface of the cap insulation film 14 at this stage conforms to the upper surface of the insulation film 38.

Thereafter, as shown in FIG. 14, until the upper surface of the cap insulation film 14 conforms to the upper surface of the separation portion 2, the upper portion of the cap insulation film 14 is selectively etched by a wet etching method, and then, the insulation film 38 and the insulation film 35 of a lower layer thereof is removed by the wet etching method, and thereby, as shown in FIG. 15 and FIG. 16, an insulation trench portion (second separation portion) 10A is formed. The insulation trench portion 10A is a portion in which the penetrating separation portion 10 is formed, and a plane shape thereof is a frame shape. Inside of this insulation trench portion 10A, an active region L in which the penetrating electrode 8 is arranged is arranged. A structure of the insulation trench portion 10A is the same as that of the penetrating separation portion 10, except that it does not penetrate the main and rear surfaces of the substrate 1S. The insulation trench portion 10A is arranged in a plane surface of the separation portion 2. The upper surface of the cap insulation film 14 of the insulation trench portion 10A at this stage conforms or nearly conforms to the upper surface of the separation portion 2. That is, the flatness in the surface of the separation portion 2 is secured. In particular, in the present embodiment, the cap insulation film 14 is formed of insulation material having the same or almost the same range of an etching rate as that of the insulation film 2b of the separation portion 2, for example. Thereby, reduction amounts of the separation portion 2 and the cap insulation film 14 by etching in a cleaning processing and an etching processing in the following manufacture process can be the same or almost the same, and consequently, the flatness of the upper surface of the separation portion 2 can be secured. That is, since the flatness of the main surface of the substrate 1S can be secured, various defects such as wire disconnection failures, incomplete exposure, fluctuations of electric characteristics of the wiring layer or the like can be restrained or prevented. Note that, in FIG. 15, for easy recognition of the drawing, hatching is made in the insulation trench portion 10A. And, the element is not formed on the wafer 1WB at this stage.

Figure 17:
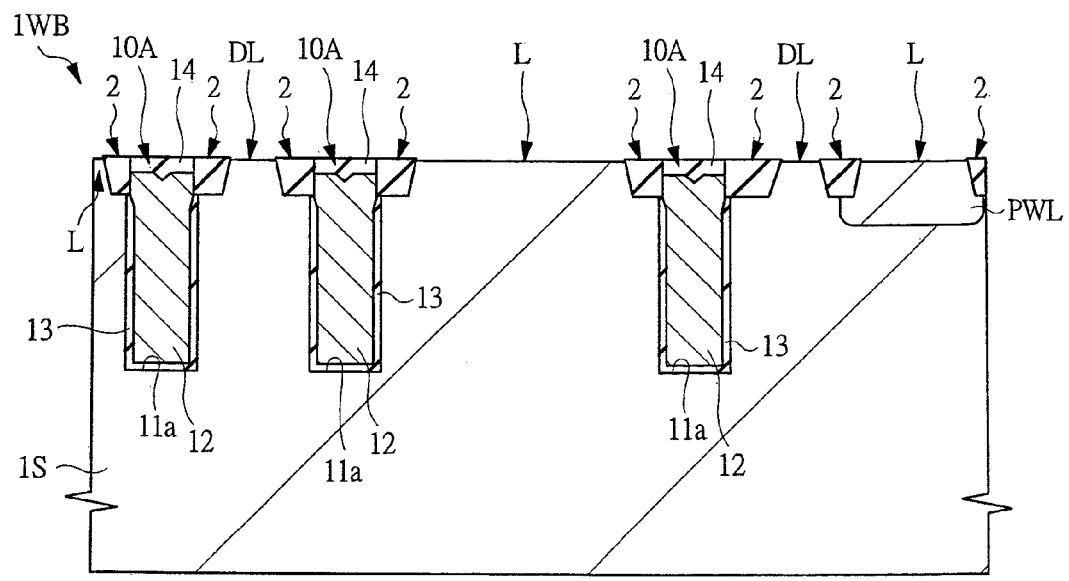
FIG. 17 is a cross sectional view showing a portion corresponding to the X1-X1 line in FIG. 15 of a semiconductor wafer after a well formation process subsequent to FIG. 16.
Figure 18:
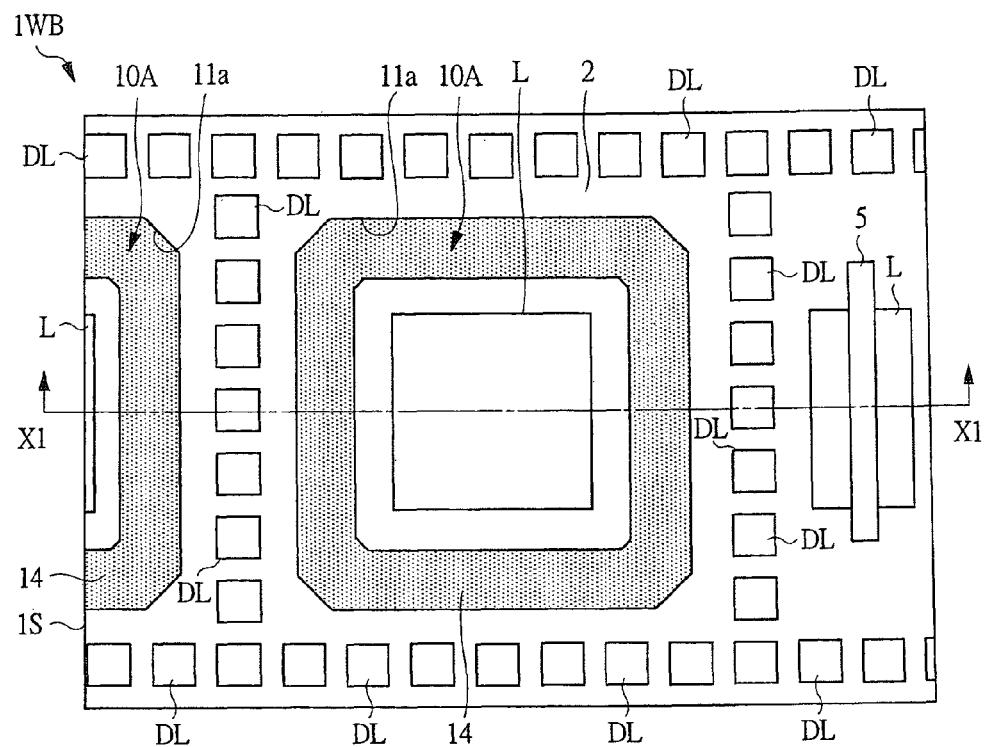
FIG. 18 is a plan diagram showing a main portion of a main surface of a semiconductor wafer after a gate insulation film and gate electrode formation process subsequent to FIG. 17.
Figure 19:
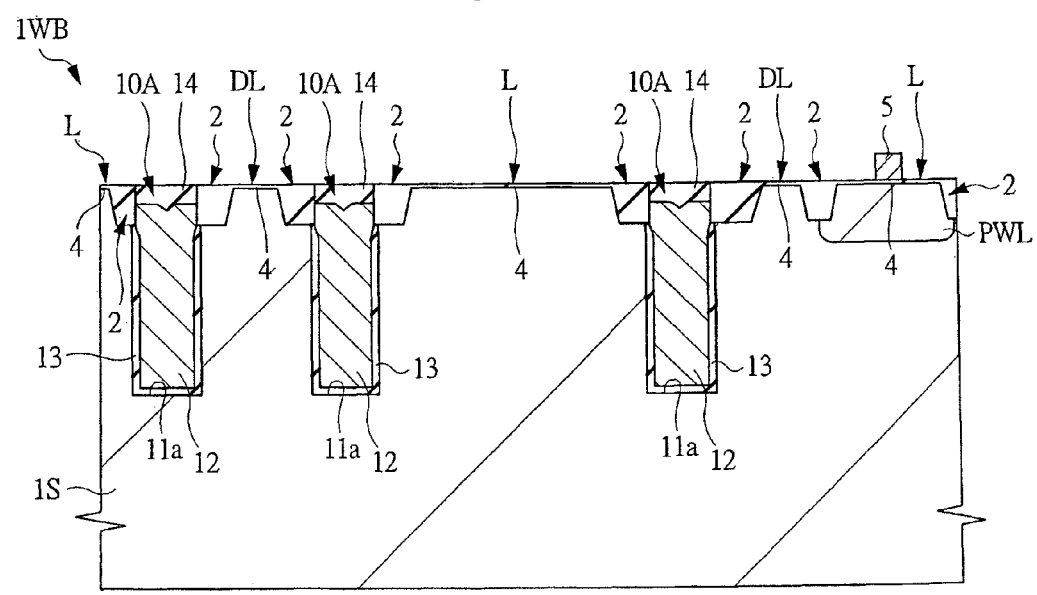
FIG. 19 is a cross sectional view along X1-X1 line in FIG. 18.
Figure 20:
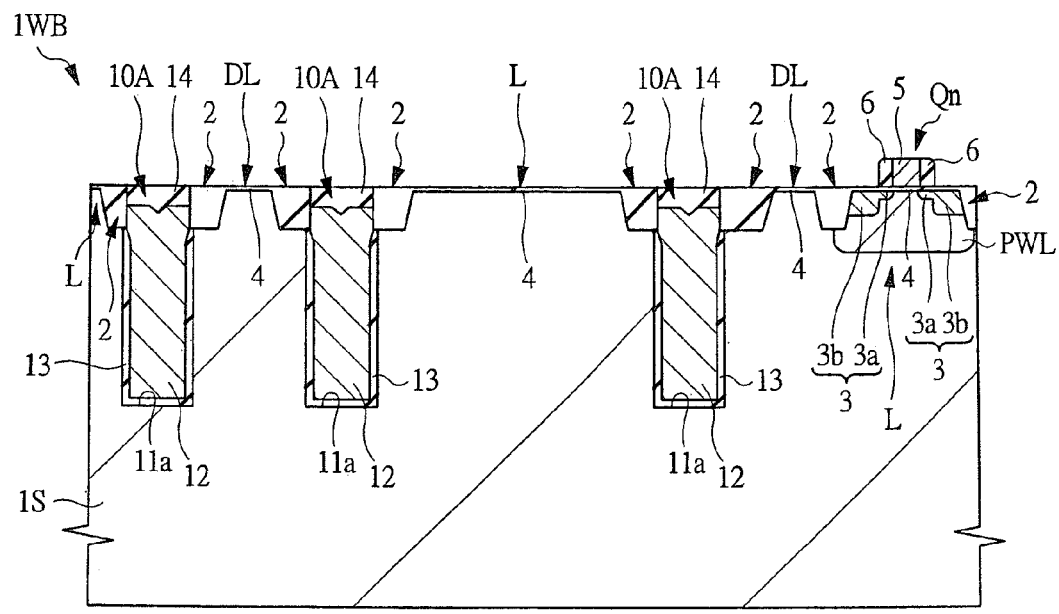
FIG. 20 is a cross sectional view along the X1-X1 line in FIG. 18 of a semiconductor wafer after a source and drain formation process subsequent to FIG. 19.

Next, the procedure shifts to an element formation process (processes 103 to 107 in FIG. 3). Hereinafter, the element formation process is explained with reference to FIG. 17 to FIG. 20. FIG. 17 is a cross sectional view showing a portion corresponding to the X1-X1 line in FIG. 15 of the wafer 1WB after a well formation process subsequent to FIG. 16, FIG. 18 is a plan diagram showing a main portion of the main surface of the wafer 1WB after the gate insulation film and gate electrode formation process subsequent to FIG. 17, FIG. 19 is a cross sectional view along an X1-X1 line in FIG. 18 and FIG. 20 is a cross sectional view of the X1-X1 line in FIG. 18 of the wafer 1WB after a source and drain formation process subsequent to FIG. 19. Note that, herein, a case in which an n-channel type MIS•FET is formed as an element is explained, for example.

First, as shown in FIG. 17, after forming a resist pattern for well formation by photolithography technology on the main surface of the wafer 1WB, using this as a mask, a p-type well PWL is formed (process 103 in FIG. 3) in the active region L for element formation of the substrate 1S exposing from the resist pattern by introducing impurities such as boron (B) and the like for example by an ion implantation method and the like.

Next, using the resist pattern as a mask, to the p-type well PWL in the active region L for element formation of the substrate 1S exposed therefrom, desired impurities are introduced by an ion implantation method and the like. This process is an impurity introduction process for formation of a channel of the n-channel type MIS•FET, and thereby a threshold value voltage and the like of the n-channel type MIS•FET are adjusted (process 104 in FIG. 3).

Thereafter, after removing the resist pattern for formation of a well and a channel, a thermal oxidization process is carried out to the substrate 1S of the wafer 1WB, and thereby as shown in FIG. 18 and FIG. 19, on the main surface of the active region L and the dummy active region DL of the substrate 1S, a gate insulation film 4 made of, for example, silicon oxide is formed (process 105 in FIG. 3), and then on the main surface of the wafer 1WB, for example, a polycrystal silicon film with low resistance is deposited by the CVD method and the like, and by patterning this by photolithography technology and etching technology, a gate electrode 5 is formed over the gate insulation film 4 (process 106 in FIG. 3).

Next, on the main surface of the wafer 1WB, a resist pattern exposing the MIS•FET formation region is formed by photolithography technology, and using the resist pattern and the gate electrode 5 as a mask, impurities such as phosphorous (P), arsenic (As) or the like are introduced to a p-type well PWL of the substrate 1S by an ion implantation method and the like, then the resist pattern is removed. Thereby, as shown in FIG. 20, an $n^-$-type semiconductor region 3a for source and drain of MIS•FET is formed in a self-alignment manner with respect to the gate electrode 5.

Next, on the main surface of the wafer 1WB, an insulation film made of, for example, silicon oxide is deposited by the CVD method and the like, and further the insulation film is etched back by an anisotropic dry etching method and the like, and thereby side walls 6 are formed on side surfaces of the gate electrode 5.

Thereafter, on the main surface of the wafer 1WB, a resist pattern exposing the MIS•FET formation region is formed by photolithography technology, and using the resist pattern, the gate electrode 5 and the side walls 6 as a mask, impurities such as phosphorous, arsenic or the like are introduced to a p-type well PWL of the substrate 1S by an ion implantation method and the like, then the resist pattern is removed. Thereby, an $n^+$-type semiconductor region 3b for source and drain of the MIS•FET is formed in a self-alignment manner with respect to the gate electrode 5 and the side walls 6 (process 107 in FIG. 3).

Thus, on the active region L in the main surface of the substrate 1S, an n-channel type MIS•FET Qn is formed. A semiconductor region 3 for source and drain of the n-channel type MIS•FET Qn has a so-called LDD (Lightly Doped Drain) structure having an $n^-$-type semiconductor region 3a and an $n^+$-type semiconductor region 3b with a higher impurity concentration than the $n^-$-type semiconductor region.

Figure 21:
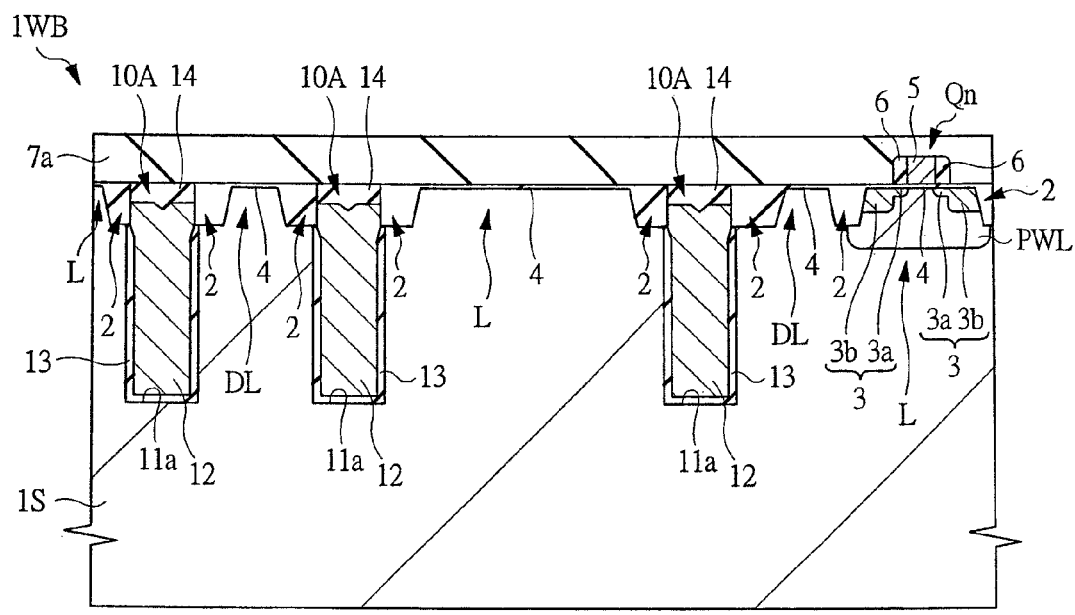
FIG. 21 is a cross sectional view showing a portion corresponding to the X1-X1 line in FIG. 18 of a semiconductor wafer after an interlayer insulation film deposition process subsequent to FIG. 20.

Next, the procedure shifts to a formation process of the conductive trench portion (process 108 in FIG. 3). Hereinafter, this formation process of the conductive trench portion is explained with reference to FIG. 21 to FIG. 26. FIG. 21 is a cross sectional view showing a portion corresponding to the X1-X1 line in FIG. 18 of the wafer 1WB after an interlayer insulation film deposition process subsequent to FIG. 20, FIG. 22 is a cross sectional view showing a portion corresponding to the X1-X1 line in FIG. 18 of the wafer 1WB in a conductive groove formation process subsequent to FIG. 21 and FIG. 23 is a cross sectional view showing a portion corresponding to the X1-X1 line in FIG. 18 of the wafer 1WB after the conductive groove formation process subsequent to FIG. 22.

First, as shown in FIG. 21, on a whole of the main surface of the wafer 1WB, an interlayer insulation film (third insulation film) 7a made of, for example, silicon oxide is deposited by the CVD method and the like. The MIS•FET Qn, the insulation trench portion 10A, the separation portion 2 and the gate insulation film 4 on the main surface of the substrate 1S are covered with the interlayer insulation film 7a. The upper surface of the interlayer insulation film 7a is formed flat.

Figure 22:
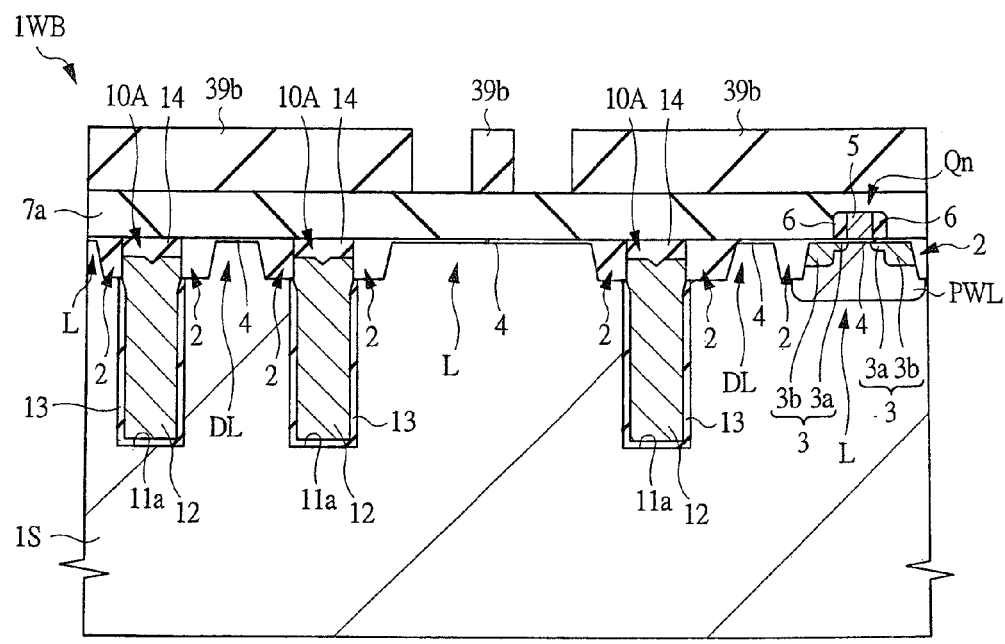
FIG. 22 is a cross sectional view showing a portion corresponding to the X1-X1 line in FIG. 18 of a semiconductor wafer in a conductive groove formation process subsequent to FIG. 21.

Next, as shown in FIG. 22, over the interlayer insulation film 7a, a resist pattern 39b is formed by photolithography technology. The resist pattern 39b is formed into a pattern so that the formation region of the conductive trench portion (penetrating electrode 8) is exposed and the other regions are covered.

Figure 23:
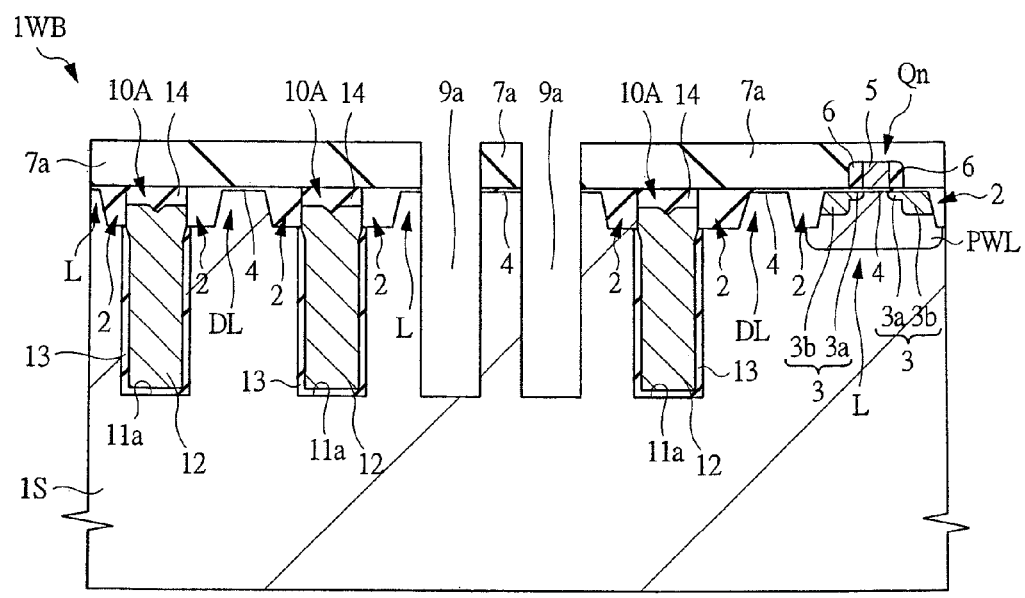
FIG. 23 is a cross sectional view showing a portion corresponding to the X1-X1 line in FIG. 18 of a semiconductor wafer after the conductive groove formation process subsequent to FIG. 22.

Thereafter, as shown in FIG. 23, using the resist pattern 39b as an etching mask, the interlayer insulation film 7a, the gate insulation film 4 and the substrate 1SB exposed therefrom is etched and removed in order. Thereby, after forming a conductive groove (second groove) 9a in the main surface of the substrate 1S, the resist pattern 39b is removed. This conductive groove 9a is a groove in which the penetrating hole 9 is formed and is formed so as to extend to a third position which is in a midstream of a thickness direction of the substrate 1S from the upper surface of the interlayer insulation film 7a of the main surface of the substrate 1S and is deeper than the first position (depth of the separation groove 2a).

Figure 24:
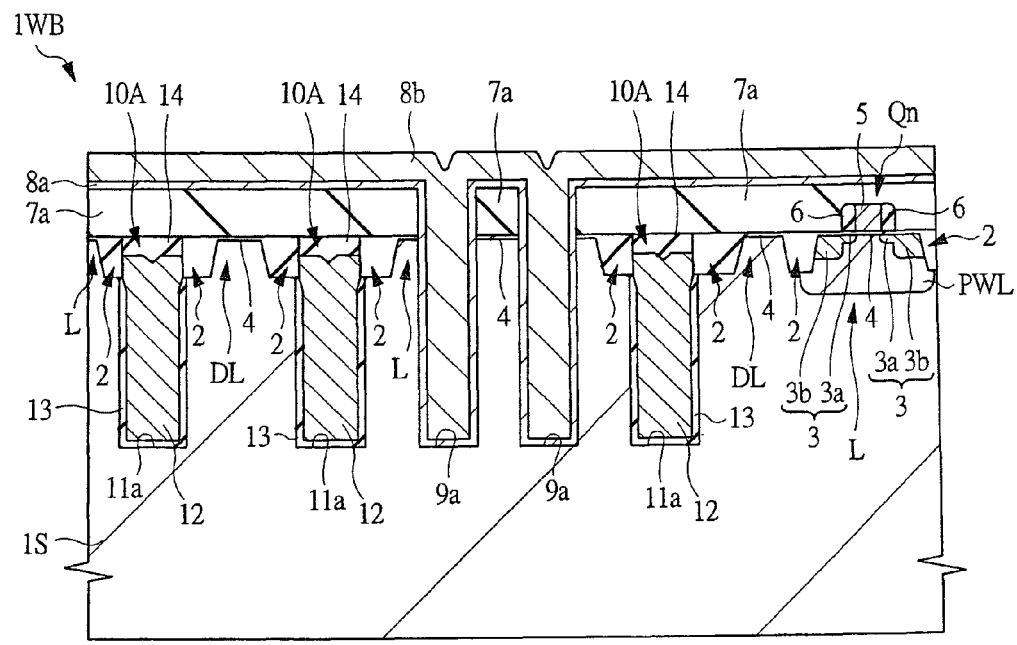
FIG. 24 is a cross sectional view showing a portion corresponding to the X1-X1 line in FIG. 18 of a semiconductor wafer after the conductive film deposition process subsequent to FIG. 23.
Figure 25:
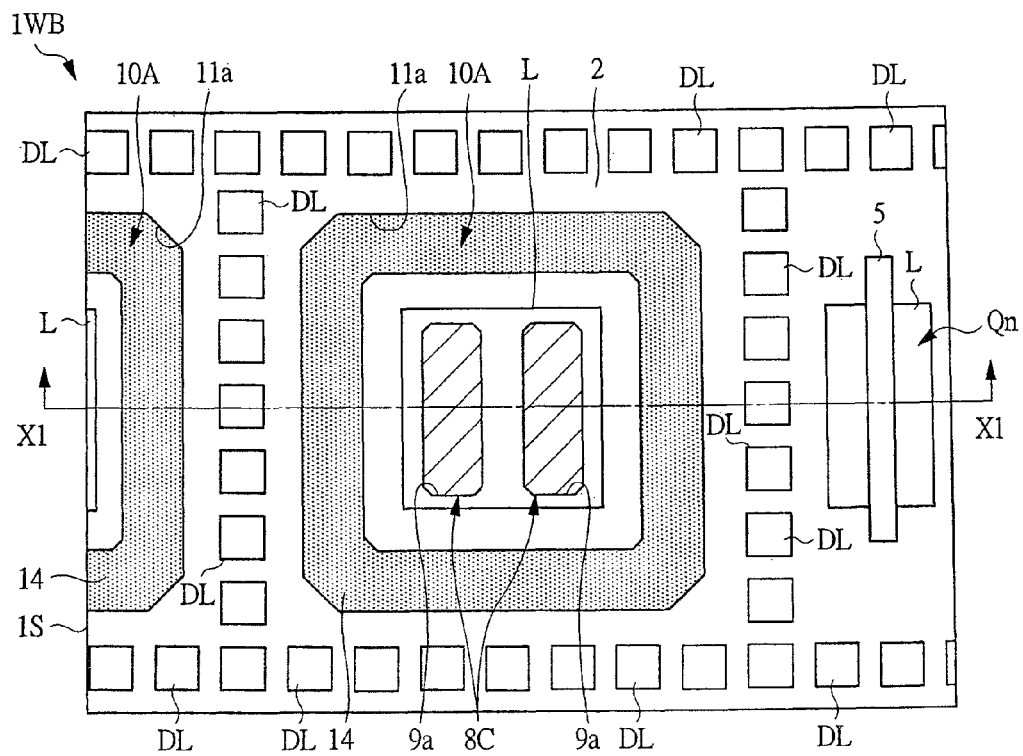
FIG. 25 is a plan diagram showing a main portion of a main surface of a semiconductor wafer after a conductive trench formation process subsequent to FIG. 24.
Figure 26:
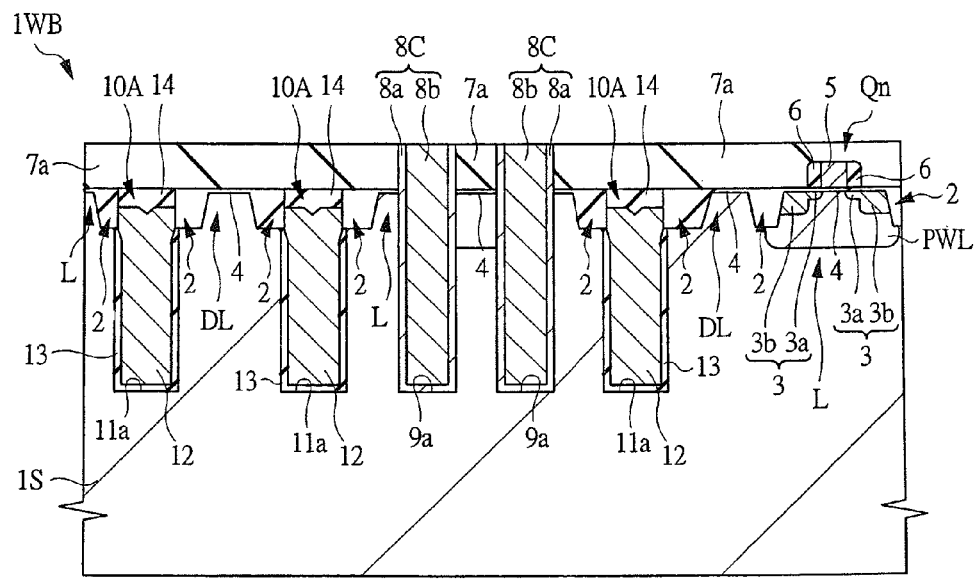
FIG. 26 is a cross sectional view along X1-X1 line in FIG. 25.

Next, FIG. 24 is a cross sectional view showing a portion corresponding to the X1-X1 line in FIG. 18 of the wafer 1WB after a conductive film deposition process subsequent to FIG. 23, FIG. 25 is a plan diagram showing a main portion of the main surface of the wafer 1WB after a conductive trench formation process subsequent to FIG. 24 and FIG. 26 is a cross sectional view along an X1-X1 line in FIG. 25.

First, as shown in FIG. 24, after depositing a barrier conductive film 8a made of, for example, titanium nitride and the like on the main surface of the wafer 1WB by a spattering method and the like, a main conductive film 8b made of, for example, tungsten and the like is deposited by the CVD method and the like and the conductive groove 9a is embedded with the barrier conductive film 8a and the main conductive film 8b. The barrier conductive film 8a is formed so as to cover side surfaces and bottom surface of the main conductive film 8b and directly contacts the substrate 1S via inside surfaces (side surface and bottom surface) of the conductive groove 9a. Thickness of the barrier conductive film 8a is thinner than thickness of the main conductive film 8b.

Next, by polishing the main conductive film 8b and the barrier conductive film 8a by the CMP method and the like, as shown in FIG. 25 and FIG. 26, a superfluous main conductive film 8b and barrier conductive film 8a outside of the conductive groove 9a are removed and the main conductive film 8b and the barrier conductive film 8a are left only inside the conductive groove 9a. Thus, a conductive trench portion (conductive portion) 8C is formed inside the conductive groove 9a. Note that, in FIG. 25, for easy recognition of the drawing, hatching is made in the insulation trench portion 10A and the conductive trench portion 8C.

The conductive trench portion 8C is a portion in which the penetrating electrode 8 is formed. The structure of the this conductive trench portion 8C is the same as that of the penetrating electrode 8, except that it does not penetrate the main and rear surfaces of the substrate 1S. Here, two pieces of the conductive trench portion 8C are arranged in one active region L, as shown in FIG. 25. In the present embodiment, since the conductive trench portion 8C is formed of metal as described above, electric resistance of the conductive trench portion 8C (that is, the penetrating electrode 8) can be decreased significantly in comparison with a case in which the conductive trench portion 8C is formed of polycrystal silicon having low resistance. In particular, in the present embodiment, a plane shape of the conductive trench portion 8C is a large rectangular shape (a shape in which a length in an up-down direction is longer than a length a length in a left-right direction perpendicular thereto, in FIG. 25). Thereby, volume of the conductive trench portion 8C can be secured to be large, and accordingly, electric resistance of the conductive trench portion 8C can be decreased further. And, the upper surface of the conductive trench portion 8C conforms to the upper surface of the interlayer insulation film 7a. Thereby, flatness of the upper surface of the interlayer insulation film 7a is secured.

At a position away from this conductive trench portion 8C, the insulation trench portion 10A described above is arranged so as to surround the conductive trench portion 8C. Thus, in the present embodiment, since the conductive trench portion 8C and the insulation trench portion 10A are separated, the conductive trench portion 8C and the insulation trench portion 10A can be formed separately. In a case where the conductive trench portion and the insulation trench portion are one body, the conductive trench portion and the insulation trench portion must be formed in the same process, and therefore, in a case where the insulation trench portion is formed before forming elements in order to avoid fluctuations of element characteristics as mentioned above, the conductive trench portion also must be formed before forming elements. However, if the conductive trench portion is formed before forming elements, the conductive film (barrier conductive film and the main conductive film) for forming the conductive trench portion is deposited on a layer extremely close to the substrate 1S, and accordingly a problem that a possibility to cause the deterioration of element characteristics and metal contamination is high occurs. On the other hand, in the present embodiment, as mentioned above, the conductive trench portion 8C and the insulation trench portion 10A can be formed separately. Here, as mentioned above, the conductive trench portion 8C can be formed after forming an element (MIS•FET Qn) and the interlayer insulation film 7a. Thereby, the possibility of the deterioration of element characteristics and the metal contamination can be reduced further. Accordingly, the electric characteristics of the element can be improved.

Figure 27:
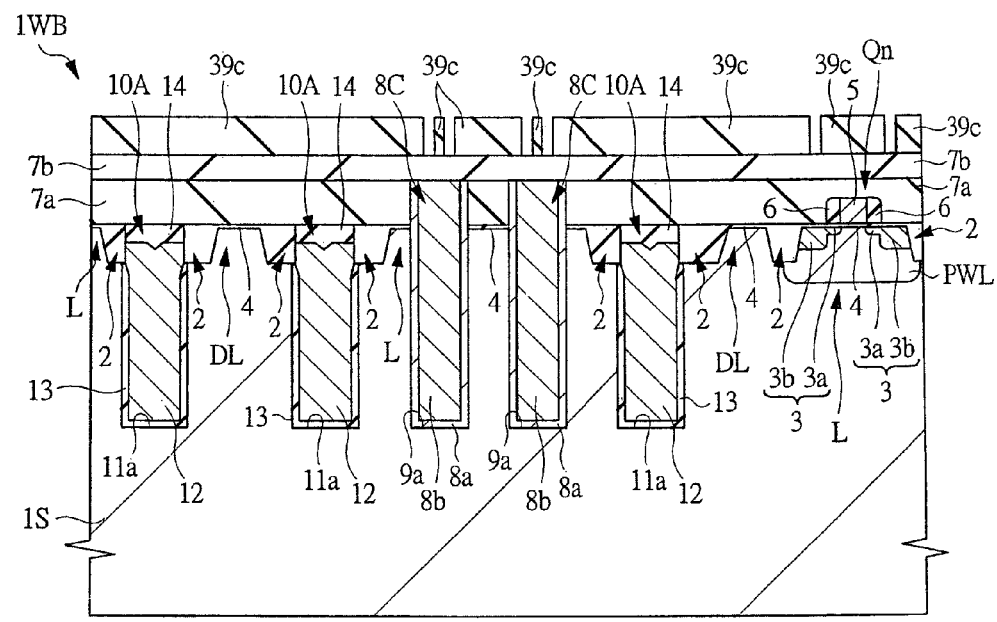
FIG. 27 is a cross sectional view showing a portion corresponding to the X1-X1 line in FIG. 25 of a semiconductor wafer in a plug formation process subsequent to FIG. 26.
Figure 29:
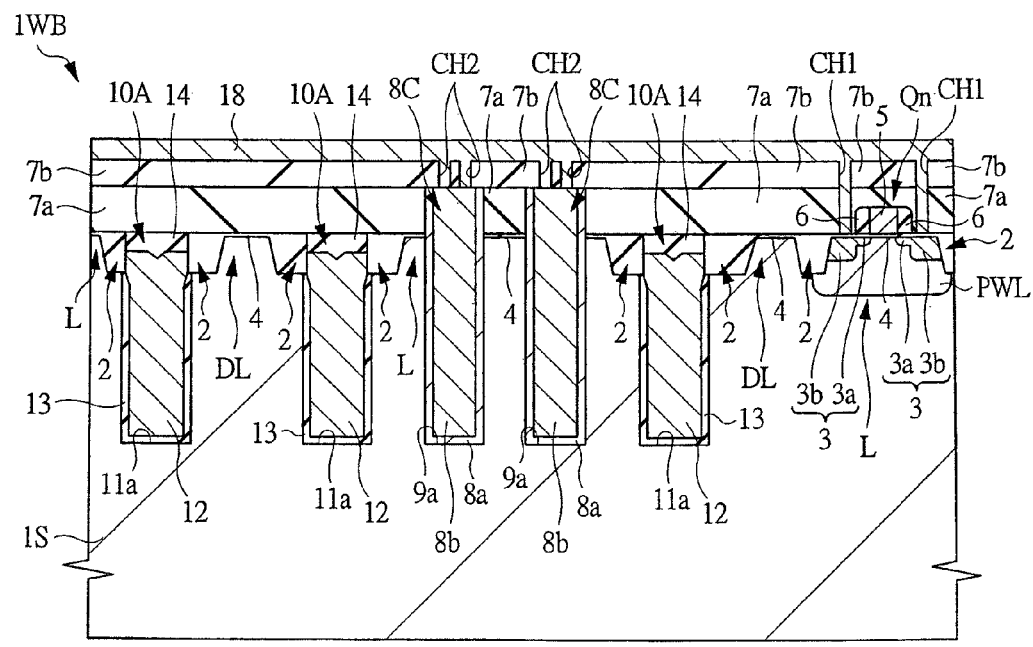
FIG. 29 is a cross sectional view showing a portion corresponding to the X1-X1 line in FIG. 25 of a semiconductor wafer in the plug formation process subsequent to FIG. 28.
Figure 30:
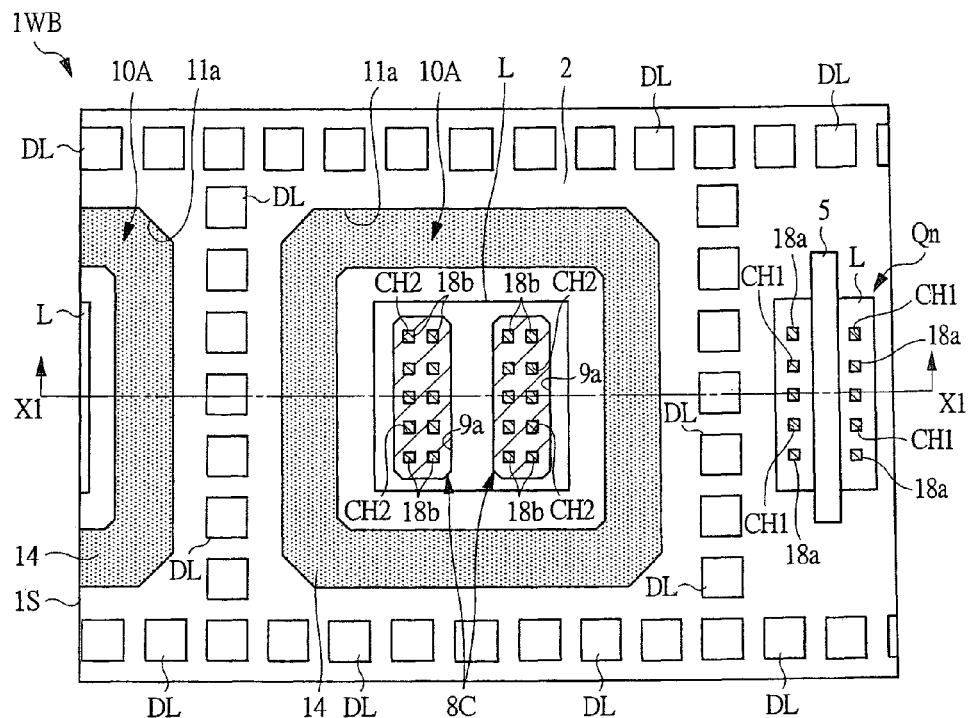
FIG. 30 is a plan diagram showing a main portion of a main surface of a semiconductor wafer after the plug formation process subsequent to FIG. 29.
Figure 31:
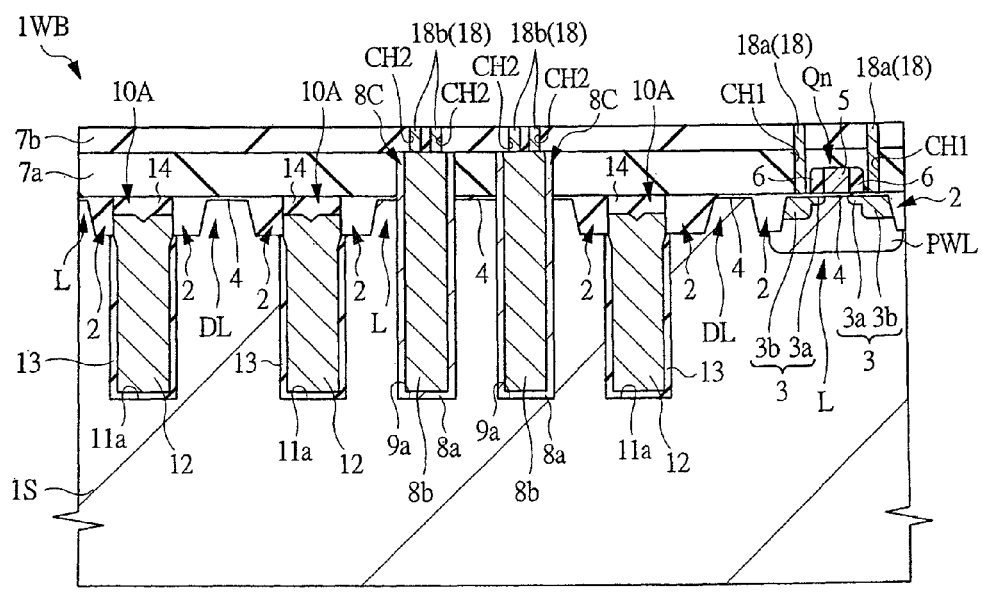
FIG. 31 is a cross sectional view along X1-X1 line in FIG. 30.
Figure 32:
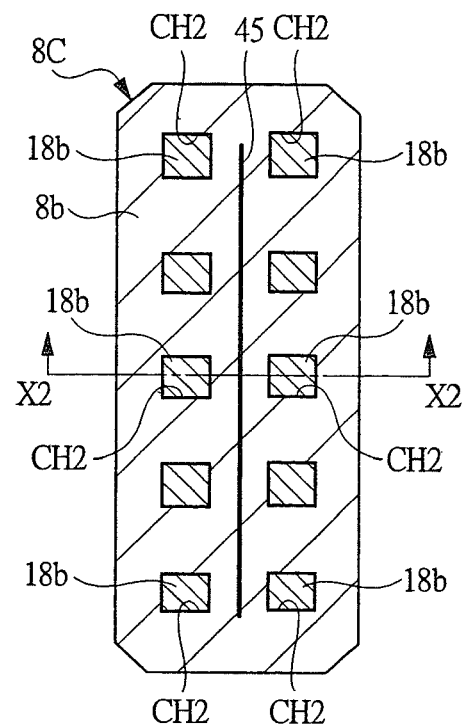
FIG. 32 is an enlarged plan diagram showing a conductive trench portion in FIG. 30.
Figure 33:
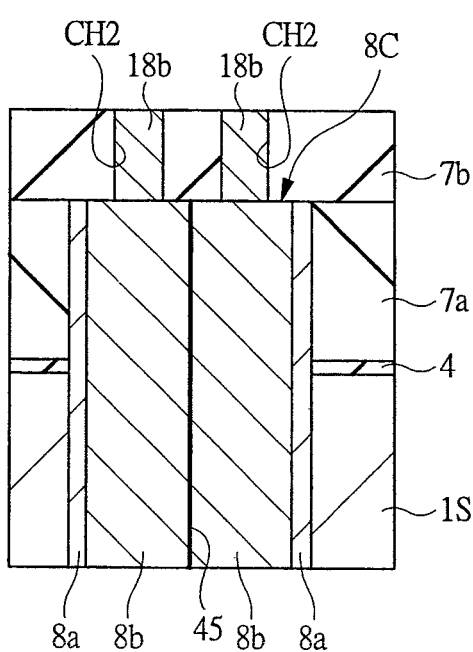
FIG. 33 is an enlarged cross sectional view along X1-X1 line in FIG. 32.

Next, the procedure shifts to a formation process of the wiring layer (process 109 in FIG. 3). Hereinafter, this formation process of the wiring layer is explained with reference to FIG. 27 to FIG. 36. FIG. 27 is a cross sectional view showing a portion corresponding to the X1-X1 line in FIG. 25 of the wafer 1WB in a plug formation process subsequent to FIG. 26, FIG. 28 is a cross sectional view showing a portion corresponding to the X1-X1 line in FIG. 25 of the wafer 1WB in the plug formation process subsequent to FIG. 27, FIG. 29 is a cross sectional view showing a portion corresponding to the X1-X1 line in FIG. 25 of the wafer 1WB in the plug formation process subsequent to FIG. 28, FIG. 30 is a plan diagram showing a main portion of the main surface of the wafer 1WB after the plug formation process subsequent to FIG. 29, FIG. 31 is a cross sectional view along an X1-X1 line in FIG. 30, FIG. 32 is an enlarged plan diagram showing a conductive trench portion 8C in FIG. 30, and FIG. 33 is an enlarged cross sectional view showing a main portion along an X2-X2 line in FIG. 32.

First, as shown in FIG. 27, on the main surface of the wafer 1WB, an interlayer insulation film (fourth insulation film) 7b made of, for example, silicon oxide is deposited by the CVD method and the like, then over the interlayer insulation film 7b, a resist pattern 39c for formation of a contact hole is formed by photolithography technology. The resist pattern 39c is formed into a flat shape which exposes a formation region of the contact hole in the conductive trench portion 8C and its peripheral MIS•FET Qn and covers the other regions.

Figure 28:
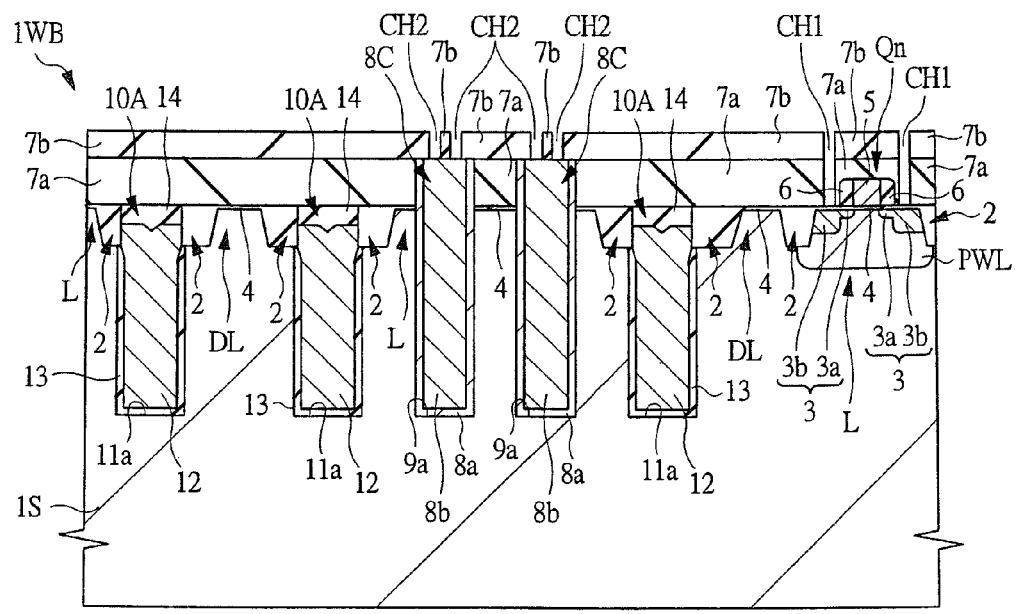
FIG. 28 is a cross sectional view showing a portion corresponding to the X1-X1 line in FIG. 25 of a semiconductor wafer in the plug formation process subsequent to FIG. 27.

Then, using the resist pattern 39c as an etching mask, by etching the interlayer insulation films 7b and 7a exposed therefrom in order, as shown in FIG. 28, in the interlayer insulation films 7b and 7a, a plurality of contact holes (first connection holes) CH1 exposing an upper surface of the n$^+$-type semiconductor region 3b for source and drain of MIS•FET Qn is formed, and in the interlayer insulation film 7b, a plurality of contact holes (second connection holes) CH2 exposing an upper surface of the main conductive film 8b of the conductive trench portion 8C is formed. Then, after removing the resist pattern 39c, and as shown in FIG. 29, on the main surface of the wafer 1WB, a conductive film 18 made of, for example, a high melting point metal such as tungsten and the like is deposited by the CVD method and the like so as to embed the contact holes CH1 and CH2.

Next, by polishing the conductive film 18 by the CMP method and the like, as shown in FIG. 30 to FIG. 33, a superfluous conductive film 18 at outside of the contact holes CH1 and CH2 is removed and the conductive film 18 is left only inside the contact holes CH1 and CH2. Thus, a plug (connection portion) 18a is formed inside the contact hole CH1 and a plug (connection portion) 18b is formed inside the contact hole CH2. As described above, by forming the plug 18a connected to the MIS•FET Qn and the plug 18b connected to the conductive trench portion 8C at the same time, the processes can be simplified. Note that, in FIG. 30 and FIG. 32, for easy recognition of the drawing, hatching is made in the insulation trench portion 10A, the conductive trench portion 8C and the plugs 18a and 18b.

Here, in the present embodiment, the plug 18b is arranged so as to avoid center of the upper surface of the main conductive film 8b of the conductive trench portion 8C. This is for the following reason. That is, in center of the upper surface of the main conductive film 8b, a seam (hereinafter, referred to as seam portion) 45 of the main conductive film 8b growing from an outer circumference of the conductive groove 9a upon deposition of the main conductive film 8b is formed. In the seam portion 45, "pores" may be formed, and even if "pores" are not formed, film quality thereof may be inferior to that of the other portions and conductivity may be low. Therefore, if the plug 18b is arranged over this seam portion 45, a problem that contact resistance between the main conductive film 8b and the plug 18b becomes large occurs. Accordingly, in the present embodiment, the plug 18b is arranged so as to avoid the seam portion 45 at center of the upper surface of the main conductive film 8b of the conductive trench portion 8C, and thereby connectivity between the plug 18b and the main conductive film 8b can be improved, and consequently the contact resistance between the plug 18b and the main conductive film 8b can be reduced.

Figure 34:
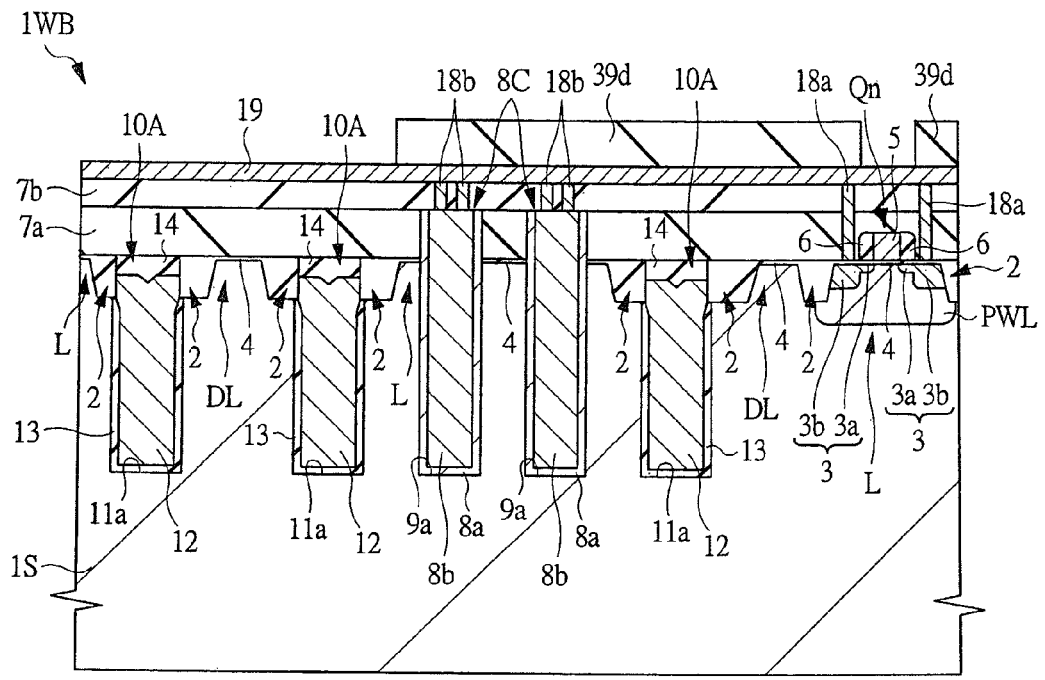
FIG. 34 is a cross sectional view showing a portion corresponding to the X1-X1 line in FIG. 30 of a semiconductor wafer in a wiring layer formation process subsequent to FIG. 31.
Figure 35:
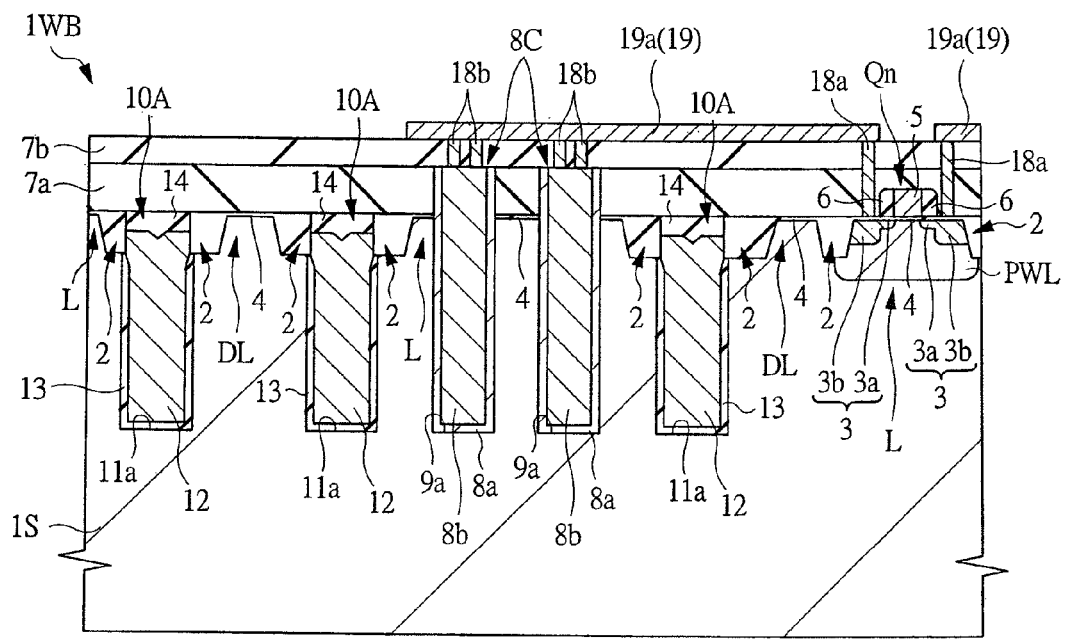
FIG. 35 is a cross sectional view showing a portion corresponding to the X1-X1 line in FIG. 30 of a semiconductor wafer in the wiring layer formation process subsequent to FIG. 34.
Figure 36:
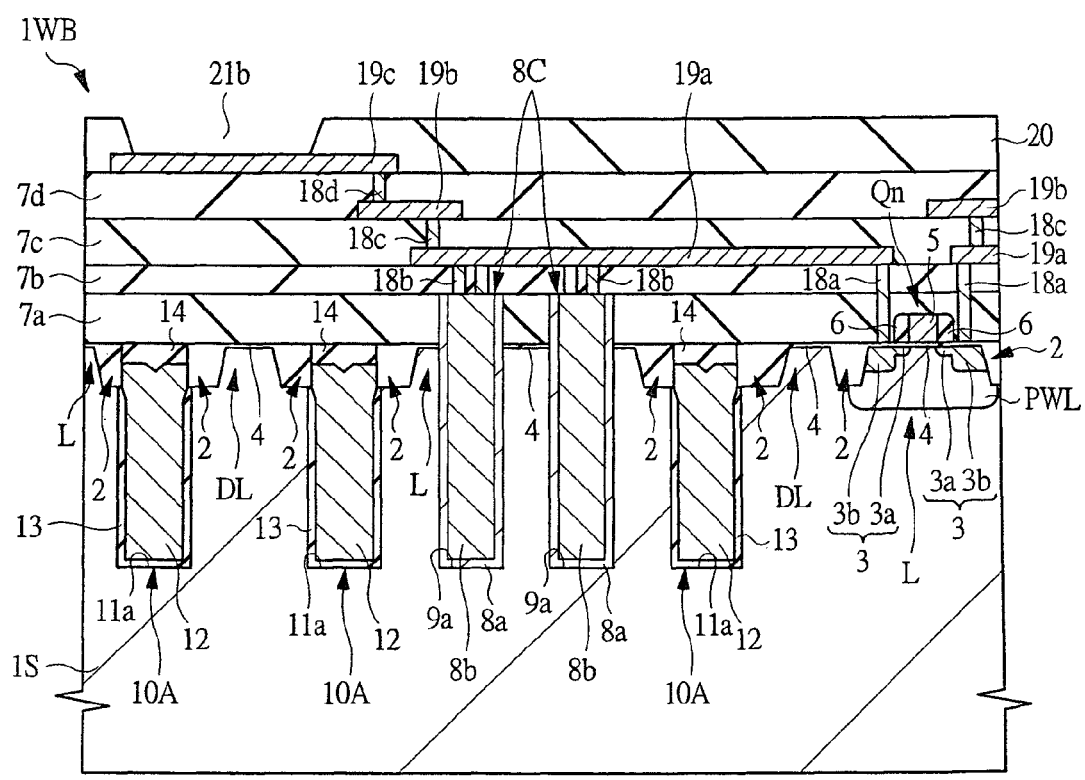
FIG. 36 is a cross sectional view showing a portion corresponding to the X1-X1 line in FIG. 30 of a semiconductor wafer in a wiring layer formation process subsequent to FIG. 35.

Next, FIG. 34 to FIG. 36 are cross sectional views showing a portion corresponding to the X1-X1 line in FIG. 30 of the wafer 1WB in a wiring layer formation process subsequent to FIG. 31.

First, as shown in FIG. 34, over the interlayer insulation film 7*b* of the main surface of the wafer 1WB, a conductive film 19 made of, for example, aluminum, aluminum alloy or the like is deposited by a spattering method and the like, and then, a resist pattern 39*d* for formation of wires is formed thereon by photolithography technology. Then, using the resist pattern 39*d* as an etching mask, the conductive film 19 exposed therefrom is etched, and thereby, as shown in FIG. 35, a first layer wire 19*a* is formed. Thereafter, the resist pattern 39*d* is removed. Here, a wire 19 electrically connecting the semiconductor region 3 for source and drain of the MIS•FET Qn and the conductive trench portion 8C is illustrated as an example. This wire 19*a* is electrically connected to one of the semiconductor regions 3 for source and drain of the MIS•FET Qn via the plug 18*a*, and also electrically connected to the conductive trench portion 8C via the plug 18*b*.

Then, by repeating the plug and wire formation processes in the same manner as the above, as shown in FIG. 36, a wiring layer of three-layers wiring structure is formed. Then, after forming a protection film 20 by depositing, for example, silicon oxide and silicon nitride in order from a lower layer over the interlayer insulation film 7*d* by the CVD method and the like to cover a top wire 19*c* of the wafer 1WB, an opening portion 21*b* exposing a part of a third layer wire 19*c* of a lower layer is formed on a part thereof by photolithography technology and etching technology.

INDUSTRIAL APPLICABILITY

The present invention can be applied to manufacturing industry of a semiconductor device having a three-dimensional structure.

The invention claimed is:

1. A semiconductor device having a pattern comprising:
   an element formed over a first surface of a semiconductor substrate and structuring an integrated circuit;
   a separation portion formed by embedding an insulation film into a groove dug in the first surface of the semiconductor substrate;
   a penetrating electrode provided to penetrate from the first surface to a second surface of the semiconductor substrate; and
   a penetrating separation portion provided so as to surround the penetrating electrode and separate the penetrating electrode from peripheral portion of the semiconductor substrate in a surface of the first surface of the semiconductor substrate and provided to penetrate from the first surface to the second surface of the semiconductor substrate,
   wherein the penetrating electrode is arranged in an active region surrounded by the separation portion and the penetrating separation portion is spaced away from the penetrating electrode and is not arranged in the active region in the pattern, and
   wherein the penetrating separation portion comprises an embedded film in a hole penetrating from an upper surface of the separation portion, at the first surface of the semiconductor substrate, to the second surface of the semiconductor substrate and a first insulation film formed so as to cover an outer circumference of the embedded film.

2. The semiconductor device according to claim 1, wherein a dummy active region is arranged around the penetrating electrode.

3. The semiconductor device according to claim 1, wherein the embedded film of the penetrating separation portion comprises a semiconductor film.

4. The semiconductor device according to claim 1, wherein the penetrating separation portion further comprises a second insulation film provided over an upper surface of the embedded film.

5. The semiconductor device according to claim 4, wherein the second insulation film is composed of insulation material having a same etching rate as an insulation film forming the separation portion.

6. The semiconductor device according to claim 1, further comprising:
   a second insulation film deposited over the first surface of the semiconductor substrate; and
   a wiring layer is formed over the second insulation film,
   wherein the wiring layer is electrically connected with the penetrating electrode, and a connection portion connecting the wiring layer and the penetrating electrode is arranged in an upper surface of a conductive portion structuring the penetrating electrode so as to avoid a seam of films forming the conductive portion.

7. The semiconductor device according to claim 1, further comprising:
   wherein the separation portion is a shallow groove-shaped isolation portion comprised of silicon oxide film.

* * * * *